(12) United States Patent
Muraki

(10) Patent No.: US 7,005,658 B2
(45) Date of Patent: Feb. 28, 2006

(54) CHARGED PARTICLE BEAM EXPOSURE APPARATUS AND METHOD

(75) Inventor: Masato Muraki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,687

(22) Filed: May 23, 2002

(65) Prior Publication Data

US 2002/0179855 A1 Dec. 5, 2002

(30) Foreign Application Priority Data

May 25, 2001 (JP) ............................ 2001-157930

(51) Int. Cl.
G21K 5/10 (2006.01)
H01J 37/08 (2006.01)

(52) U.S. Cl. ................. 250/492.22; 250/492.1
(58) Field of Classification Search ............ 250/492.22, 250/492.1
See application file for complete search history.

(56) References Cited

U.S. PATENT DOCUMENTS

| 5,864,142 | A | 1/1999 | Muraki et al. .......... 250/491.1 |
| 5,905,267 | A | 5/1999 | Muraki .................. 250/492.22 |
| 5,929,454 | A | 7/1999 | Muraki et al. .......... 250/491.1 |
| 5,939,725 | A | 8/1999 | Muraki .................. 250/492.22 |
| 5,981,954 | A | 11/1999 | Muraki .................. 250/397 |
| 6,054,713 | A | 4/2000 | Miyake et al. .......... 250/492.24 |
| 6,104,035 | A | 8/2000 | Muraki .................. 250/492.22 |
| 6,107,636 | A | 8/2000 | Muraki .................. 250/492.2 |
| 6,124,599 | A | 9/2000 | Muraki .................. 250/492.22 |
| 6,137,113 | A | 10/2000 | Muraki .................. 250/492.22 |
| 6,274,877 | B1 * | 8/2001 | Muraki .................. 250/492.23 |
| 6,392,243 | B1 | 5/2002 | Muraki .................. 250/491.1 |
| 6,566,664 | B1 | 5/2003 | Muraki .................. 250/492.2 |

FOREIGN PATENT DOCUMENTS

| JP | 10308340 A | * 11/1998 |
| JP | 10308341 A | * 11/1998 |

* cited by examiner

Primary Examiner—John R. Lee
Assistant Examiner—David A. Vanore
(74) Attorney, Agent, or Firm—Fitzpatrick, Cella, Harper & Scinto

(57) ABSTRACT

A multi-charged-particle beam drawing apparatus and method that can correct a change in positional relationship, caused by the Coulomb effect, among charged particle beams are provided. The focal lengths of two electron lenses (21, 22) that form a condenser lens (2) are adjusted individually to change a relative positional relationship between the front focal position of the condenser lens (2) and an electron source (ES). Electron beams becoming incident on an aperture array (AA) can diverge, or be focused or collimated. Therefore, positions where intermediate images (img1–img3) are to be formed can be changed, and the change in positional relationship, caused by the Coulomb effect, among the charged particle beams can be corrected.

19 Claims, 22 Drawing Sheets

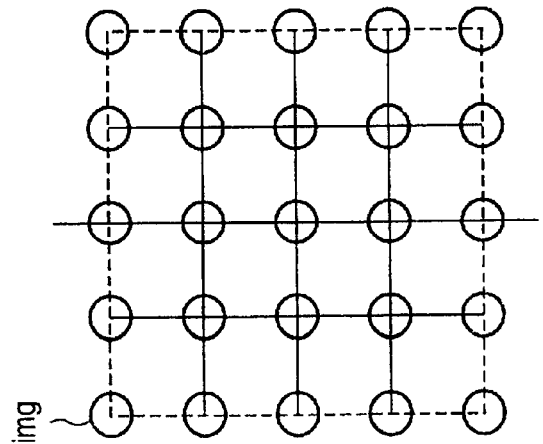
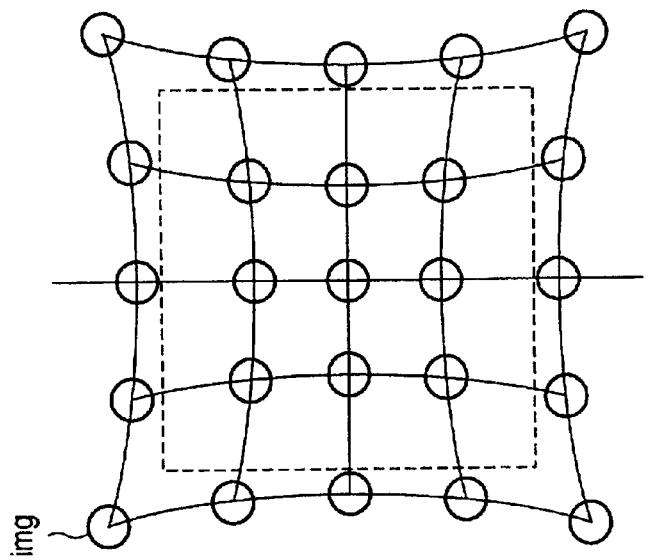
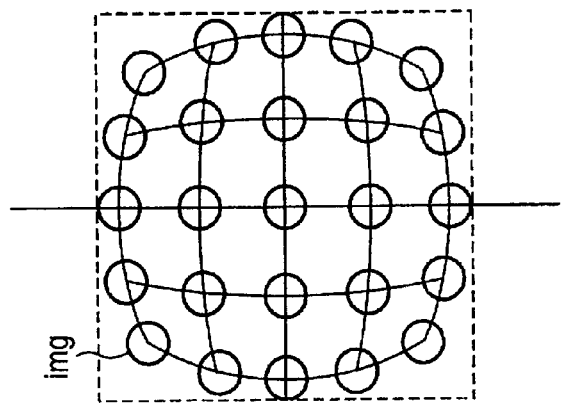
FIG. 6A
FIG. 6B
FIG. 6C

FIG. 8

| DEFLECTION NUMBER | BEAM(1, 1) | . | . | . | BEAM(n, m) |
|---|---|---|---|---|---|
| 1 | ON or OFF | ON or OFF | ON or OFF | ON or OFF | ON or OFF |
| 2 | ON or OFF | ON or OFF | ON or OFF | ON or OFF | ON or OFF |
| . | ON or OFF | ON or OFF | ON or OFF | ON or OFF | ON or OFF |
| . | ON or OFF | ON or OFF | ON or OFF | ON or OFF | ON or OFF |
| k | ON or OFF | ON or OFF | ON or OFF | ON or OFF | ON or OFF |

CHARGED PARTICLE BEAM

CHARGED PARTICLE BEAM EXPOSURE APPARATUS AND METHOD

FIELD OF THE INVENTION

The present invention relates to a charged particle beam exposure apparatus and charged particle beam exposure method and, more particularly, to a charged particle beam exposure apparatus and charged particle beam exposure method of drawing a pattern on a substrate such as a wafer directly or drawing a pattern on a master such as a mask or reticle.

BACKGROUND OF THE INVENTION

In a charged particle beam exposure apparatus which performs exposure by causing a charged particle beam to form an image on a substrate, when the current of the charged particle beam is large, the image of the charged particle beam projected on the substrate is blurred by the Coulomb effect. Although most of the blur caused by the Coulomb effect can be corrected by readjusting the focal position of a reduction electron optical system for charged particle beam projection, an uncorrected blur component remains. Conventionally, the blur to be caused by the Coulomb effect is predicted on the basis of the area of the charged particle beam and apparatus parameters (the current density, the incident half angle of the charged particle beam, the acceleration voltage of the charged particle beam, and the optical length of the reduction electron optical system). The focal point of the reduction electron optical system is adjusted in accordance with the prediction result.

The Coulomb effect not only causes a blur in the image of the charged particle beam but also displaces the position of the image of the charged particle beam on the substrate. The displacement amount of the position changes in accordance with the shape of the charged particle beam and total current. In a multi-type charged particle beam exposure apparatus which draws a pattern by scanning a plurality of charged particle beams, the positional relationship among the charged particle beams changes in accordance with the distribution of the charged particle beams during drawing. FIGS. 22A to 22C show examples of this change.

Referring to FIGS. 22A to 22C, black dots denote charged particle beams on the substrate, and gratings indicated by broken lines are gratings determined by the designed positions of the charged particle beams. When FIGS. 22A and 22B are compared, the distribution of the charged particle beams on the substrate is uniform in both FIGS. 22A and 22B, but in FIG. 22B, the number of charged particle beams is larger (that is, the total current is larger), so the positional relationship among the charged particle beams changes more largely. When FIGS. 22B and 22C are compared, the distribution of the charged particle beams is not uniform in FIG. 22C (that is, anisotropic), so the gratings to be determined by the actual charged particle beams also change anisotropically. In this manner, when the positional relationship among the charged particle beams changes, the connecting precision among patterns drawn by the respective charged particle beams degrades, and a desired pattern cannot be formed at high precision. In other words, as the distribution of the plurality of charged particle beams changes during drawing in accordance with the density of the pattern, the influence of the Coulomb effect (a change in image position) when drawing a pattern with a large density differs from the influence of the Coulomb effect when drawing a pattern with a small density. Thus, when a pattern including a pattern with a high density and a pattern with a low density is to be drawn, the connecting precision among the patterns degrades.

SUMMARY OF THE INVENTION

It is an object of the present invention to provide a charged particle beam exposure apparatus which corrects a change in positional relationship, occurring in accordance with, e.g., the density of a pattern to be drawn on a substrate, among charged particle beams, so that higher-precision drawing than in the conventional case can be realized.

According to the first aspect of the present invention, there is provided a charged particle beam exposure apparatus for drawing a pattern on a substrate by using a plurality of charged particle beams, the apparatus comprising an irradiation system which irradiates the plurality of charged particle beams onto the substrate, and a correcting mechanism which corrects an error in position of the irradiation occurring in accordance with a density of the pattern to be drawn on the substrate.

According to the preferred embodiment of the present invention, the correcting mechanism corrects an error in position of the irradiation caused by the Coulomb effect.

According to the preferred embodiment of the present invention, the correcting mechanism corrects an error in position at which the substrate is to be irradiated with the plurality of charged particle beams, in accordance with a command value determined on the basis of amounts of the plurality of charged particle beams that irradiate the substrate.

According to the preferred embodiment of the present invention, the correcting mechanism corrects an error in position at which the substrate is to be irradiated with the plurality of charged particle beams, in accordance with a command value determined on the basis of intervals among the plurality of charged particle beams that irradiate the substrate.

According to the preferred embodiment of the present invention, the apparatus may further comprise a condenser lens, and an element electron optical system array having a plurality of element electron optical systems to form a plurality of charged particle beams from a charged particle beam emitted from a charge particle beam source and provided through the condenser lens. The correcting mechanism can control the condenser lens so as to correct an error in position at which the substrate is to be irradiated with the plurality of charged particle beams formed by the element electron optical system array.

According to the preferred embodiment of the present invention, the correcting mechanism can adjust a front focal position of the condenser lens so as to correct an error in position at which the substrate is to be irradiated with the plurality of charged particle beams formed by the element electron optical system array.

According to the preferred embodiment of the present invention, the condenser lens has at least two electron lenses, and the correcting mechanism controls all or some of at least two electron lenses while maintaining an electron optical power of the condenser lens as a whole at a constant value, thereby correcting an error in position at which the substrate is to be irradiated with the plurality of charged particle beams formed by the element electron optical system.

According to the preferred embodiment of the present invention, the apparatus may further comprise a condenser lens, an aperture array having a plurality of apertures to form a plurality of charged particle beams from a charged particle beam emitted from a charge particle beam source and provided through the condenser lens, and a deflector array having a plurality of deflectors to individually deflect the plurality of charged particle beams formed by the aperture array. The correcting mechanism can control the deflector array, thereby correcting an error in position at which the substrate is to be irradiated with the plurality of charged particle beams formed by the aperture array.

The deflector array may have a first deflector array having a plurality of deflectors to individually deflect the plurality of charged particle beams formed by the aperture array in a first direction perpendicular to an optical axis, and a second deflector array having a plurality of deflectors to individually deflect the plurality of charged particle beams that have passed through the first deflector array in a second direction perpendicular to the optical axis and to the first direction. The deflector array can have a function of individually controlling whether the substrate is to be irradiated with the plurality of electron beams formed by the aperture array.

According to the second aspect of the present invention, there is provided a charged particle beam exposure apparatus for drawing a pattern on a substrate by using a plurality of charged particle beams, the apparatus comprising an irradiation system which irradiates the plurality of the charged particle beams onto the substrate, and a correcting mechanism which corrects an error in position of the irradiation occurring in accordance with a distribution of the plurality of charged particle beams that irradiate the substrate.

According to the third aspect of the present invention, there is provided a charged particle beam exposure apparatus for drawing a pattern on a substrate by using a plurality of charged particle beams, the apparatus comprising an irradiation system which irradiates the plurality of the charged particle beams onto the substrate, and a correcting mechanism which corrects an error in position caused by the Coulomb effect.

According to the fourth aspect of the present invention, there is provided a device manufacturing method comprising the steps of drawing a pattern on a photosensitive substrate by using any one of the above charged particle beam exposure apparatuses.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 6A to 6C are views for explaining position adjustment of an intermediate image according to the first embodiment of the present invention;

FIG. 8 is a table for explaining exposure control data;

DETAILED DESCRIPTION OF THE PREFERRED EMBODIMENTS

In the following description, an electron beam exposure apparatus will be described as an example of an exposure apparatus that uses a charged particle beam. Note that the present invention is not limited to an exposure apparatus that uses an electron beam but can be similarly applied to an exposure apparatus that uses an ion beam.

[First Embodiment]

Figure 1:
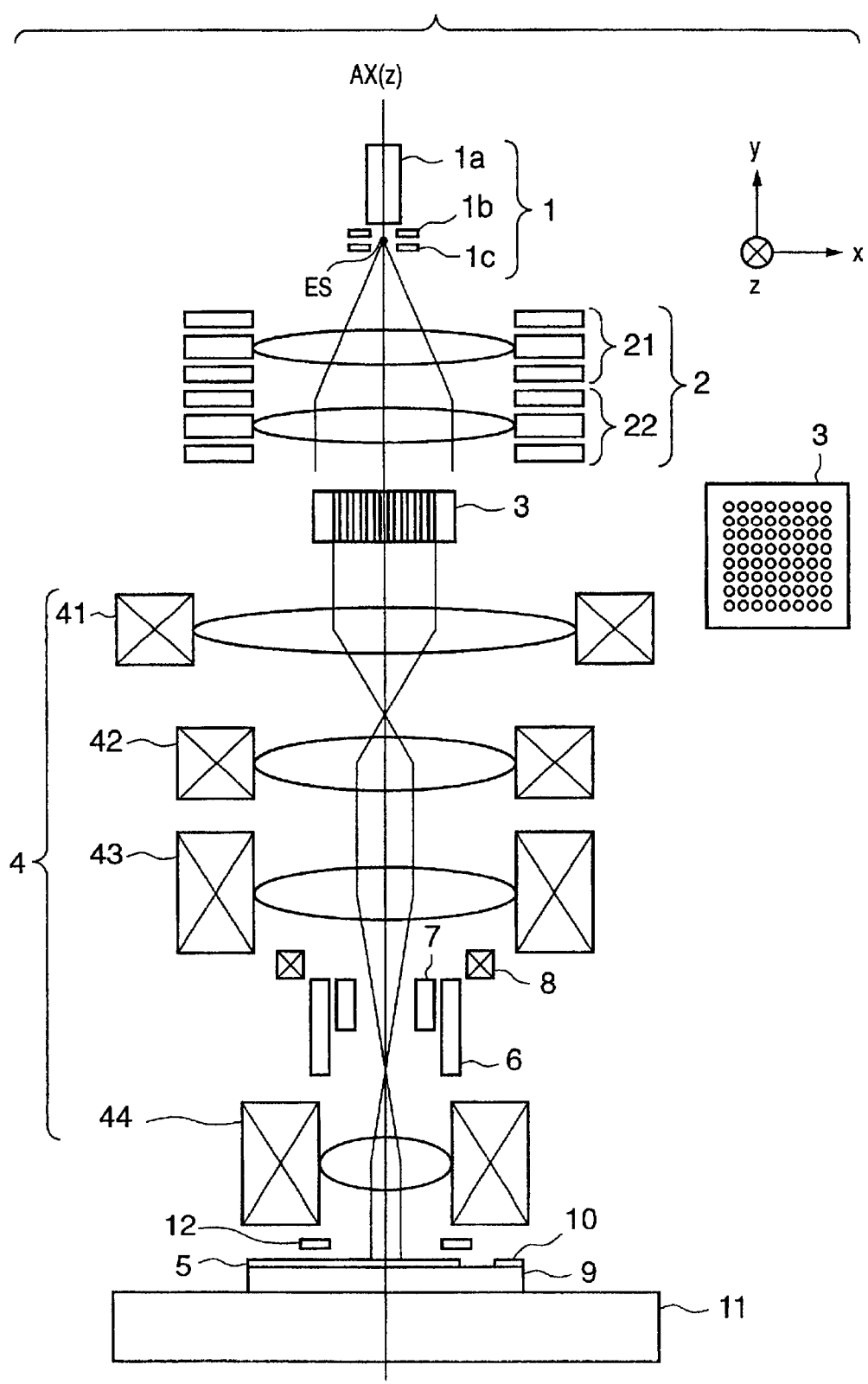
FIG. 1 is a view schematically showing the main part of an electron beam exposure apparatus according to the first embodiment of the present invention.

FIG. 1 is a view schematically showing the main part of an electron beam exposure apparatus according to the first embodiment of the present invention.

Referring to FIG. 1, reference numeral 1 denotes an electron gun constituted by a cathode 1a, grid 1b, and anode 1c. Electrons emitted from the cathode 1a form a cross-over image between the grid 1b and anode 1c. In the following description, this cross-over image is called an electron source ES.

An electron beam emitted from the electron source ES irradiates an element electron optical system array 3 through a condenser lens 2. The condenser lens 2 according to this embodiment is comprised of electron lenses (unipotential lenses) 21 and 22 each made up of three aperture electrodes.

The element electron optical system array 3 forms a plurality of intermediate images of the electron source ES. The respective intermediate images are reduced and projected by a reduction electron optical system 4 (to be described later) onto a wafer 5. Hence, the images of the electron source ES are formed on the wafer 5.

The reduction electron optical system 4 is comprised of a symmetric magnetic doublet constituted by a first projection lens 41 (43) and second projection lens 42 (44). The distance between the two lenses is f1+f2 where f1 is the focal length of the first projection lens 41 (43) and f2 is the focal length of the second projection lens 42 (44). The object point on an optical axis AX is located at the focal position of the first projection lens 41 (43), and the image point thereof is located at the focal point of the second projection lens 42 (44). The image is reduced to −f2/f1. Since the two lens magnetic fields are determined to act in opposite directions, theoretically, Seidel aberrations excluding five aberrations, i.e., spherical aberration, isotropic astigmatism, isotropic coma, curvature of field, and longitudinal chromatic aberration, and chromatic aberrations concerning rotation and magnification are canceled.

Reference numeral 6 denotes a deflector which deflects the plurality of electron beams from the element electron optical system array 3 to displace the plurality of light source images in the X and Y directions on the wafer 5 by substantially the same displacement amounts. Although not shown, the deflector 6 is comprised of a main deflector used when the deflection width is large, and a subdeflector used when the deflection width is small. The main deflector is an electromagnetic deflector, and the subdeflector is an electrostatic deflector.

Reference numeral 7 denotes a dynamic focus coil which corrects an error in focal position of the light source images which is caused by deflection aberration when the deflector 6 is operated. Reference numeral 8 denotes a dynamic stigmatic coil which corrects astigmatism of deflection aberration caused by deflection.

Reference numeral 9 denotes a θ-Z stage on which the wafer 5 is placed and which moves in the direction of the optical axis AX (Z-axis) and a rotational direction about the Z-axis. A stage reference plate 10 is fixed to the θ-Z stage 9.

Reference numeral 11 denotes an X-Y stage on which the θ-Z stage 9 is mounted and which can move in X and Y directions perpendicular to the optical axis AX (Z-axis).

Reference numeral 12 denotes a reflected electron detector which detects reflected electrons produced when a mark on the stage reference plate 10 is irradiated with the electron beam.

Figure 2A:
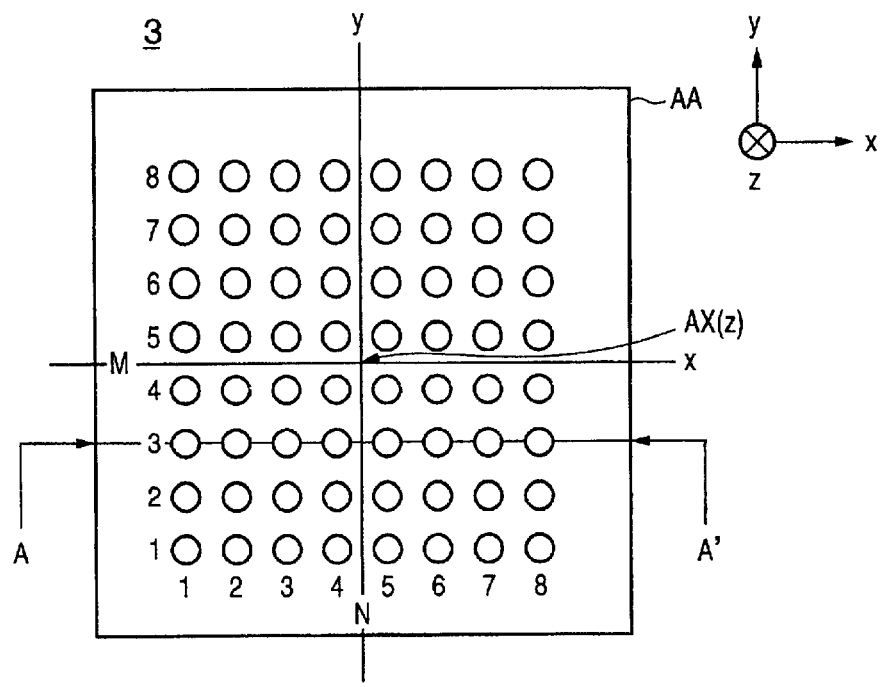
FIGS. 2A and 2B are views for explaining an element electron optical system array according to the first embodiment of the present invention.
Figure 2B:
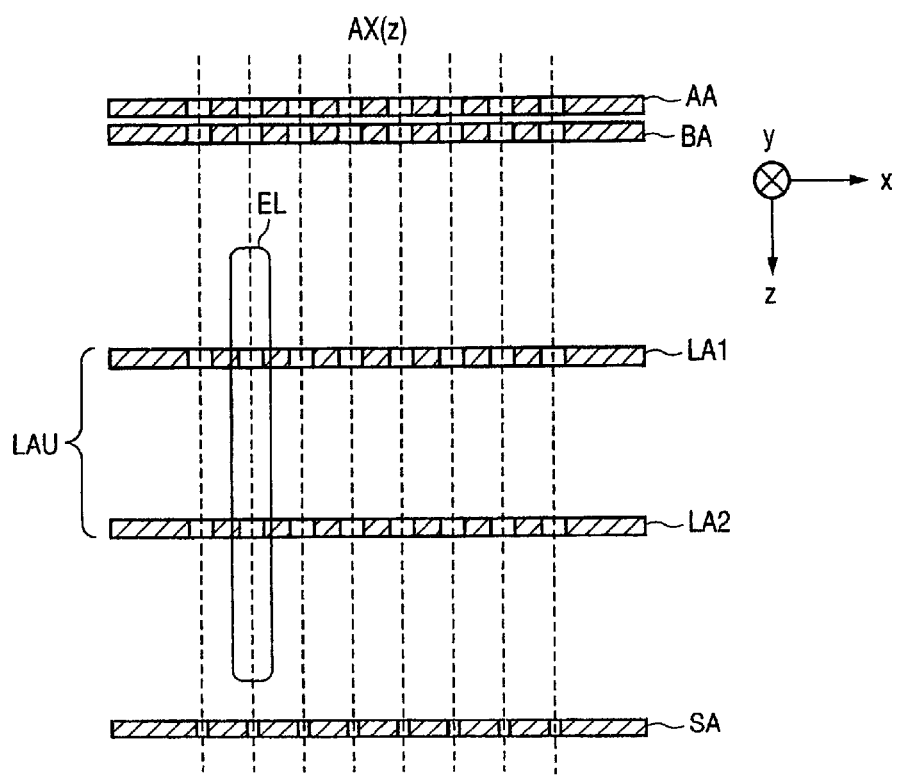

The element electron optical system array 3 used in the electron beam exposure apparatus according to the first embodiment will be described with reference to FIGS. 2A and 2B. FIG. 2A is a view of the element electron optical system array 3 seen from the electron gun 1 side, and FIG. 2B is a sectional view taken along the line A–A' of FIG. 2A.

The element electron optical system array 3 is comprised of an aperture array AA, blanker array BA, element electron optical system array unit LAU, and stopper array SA.

The aperture array AA is formed of a board with a plurality of apertures, as shown in FIG. 2A. The aperture array AA branches the electron beam emerging from the condenser lens 2 into a plurality of electron beams.

Figure 3:
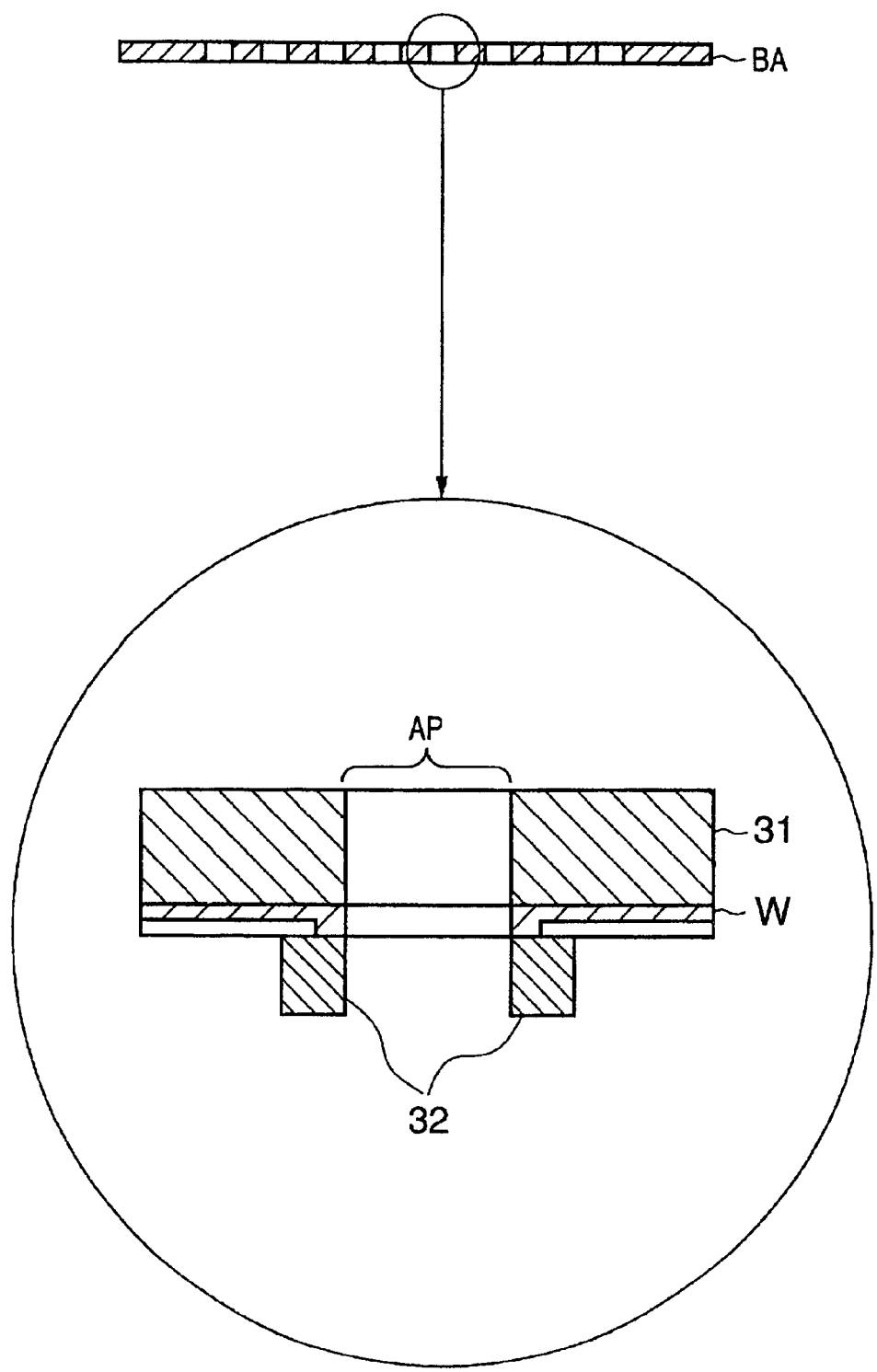
FIG. 3 is a view for explaining one deflector of a blanker array BA according to the first embodiment of the present invention.

The blanker array BA is obtained by forming a plurality of deflectors, which individually deflect the plurality of electron beams branched by the aperture array AA, on one board. FIG. 3 shows one of such deflectors in detail. A board 31 has apertures AP. Blanking electrodes 32 each formed of a pair of electrodes sandwiching one aperture AP and having a deflecting function, and wiring lines (W) for individually turning on/off the blanking electrodes 32 are formed on the board 31.

The element electron optical system array unit LAU is comprised of first and second electron optical systems LA1 and LA2, each of which is an electron lens array formed by arranging a plurality of electron lenses two-dimensionally within one plane.

Figure 4:
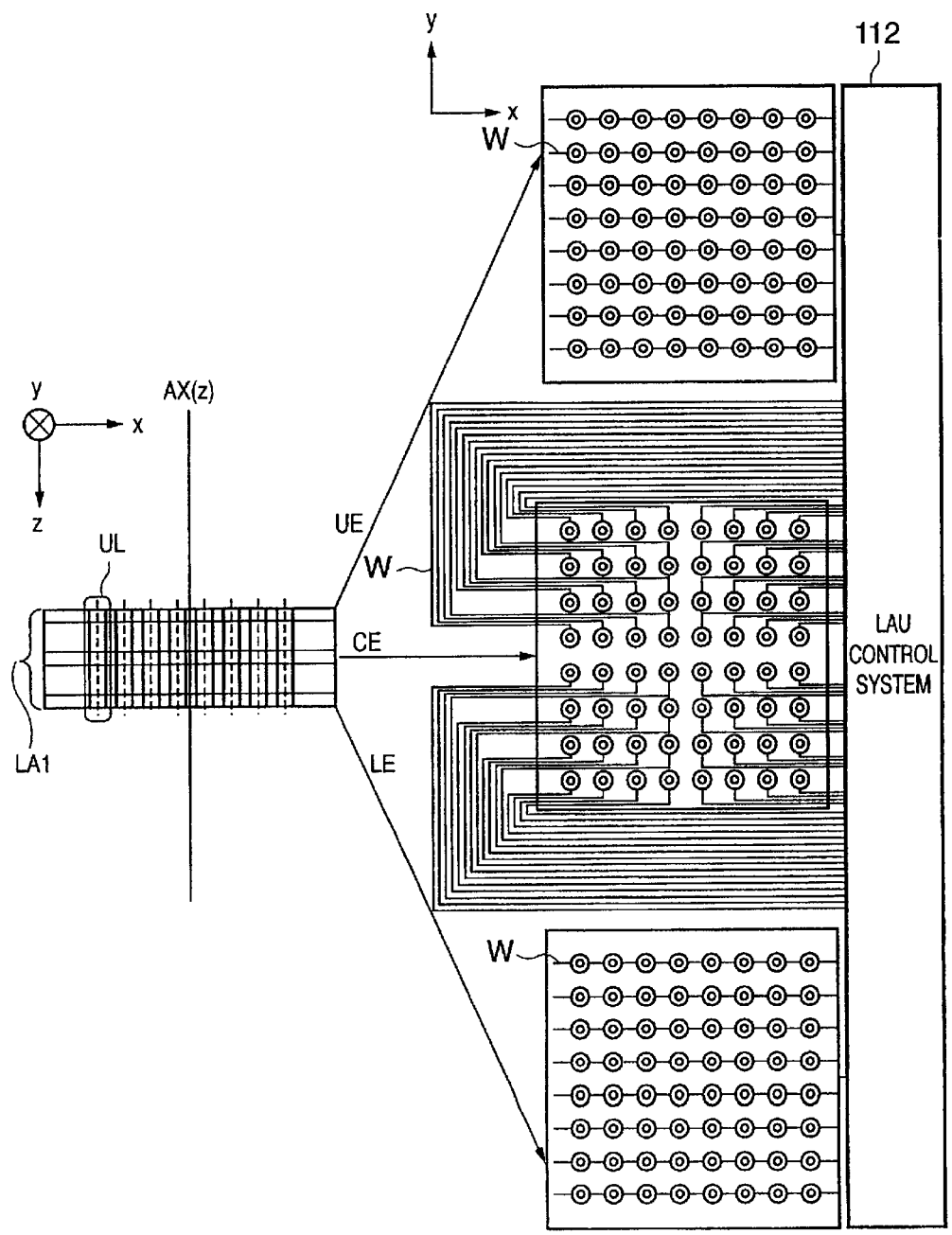
FIG. 4 is a view for explaining a first electron optical system array LA1.

FIG. 4 is a view for explaining the first electron optical system array LA1. The first electron lens array LA1 is obtained by overlappng three electrode plates, i.e., upper, intermediate, and lower electrode plates UE, CE, and LE, each having an array of a plurality of annular electrodes formed to correspond to the apertures, through insulating layers. In the first electron optical system array LA1, the annular electrodes of the upper, intermediate, and lower electrode plates, which are arranged along the common Z-axis, serve as one electron lens (a so-called unipotential lens). All the annular electrodes of the upper and lower electrode plates of each electron lens UL are connected to an LAU control circuit 112 through common wring lines (W), and are set at the same potential (in this embodiment, the potential of the upper and lower annular electrodes is set at the electron beam acceleration potential). The annular electrodes of the intermediate electrode plates of each electron lens are connected to the LAU control circuit 112 through individual wiring lines (2), and are set to desired potentials. Thus, the electron optical power (focal length) of each electron lens can be set to a desired value. The second electron optical system array LA2 has the same structure and function as those of the first electron optical system array LA1.

Referring back to FIG. 2B, in the element electron optical system array unit LAU, one electron lens of the first electron lens array LA1 and one electron lens of the second electron lens array LA2, which are arranged along the direction of the common Z-axis, constitute one element electron optical system EL. The aperture array AA is located at substantially the front focal positions of the respective element electron optical systems EL. Hence, the respective element electron optical systems EL form the intermediate images of the electron source ES at substantially their rear focal positions with the divided plurality of electron beams.

Similarly to the aperture array AA, the stopper array SA is comprised of a board having a plurality of apertures. Electron beams deflected by the blanker array BA move to the outside of the apertures of the stopper array SA corresponding to them, and do not pass through the blanker array SA.

Figure 5:
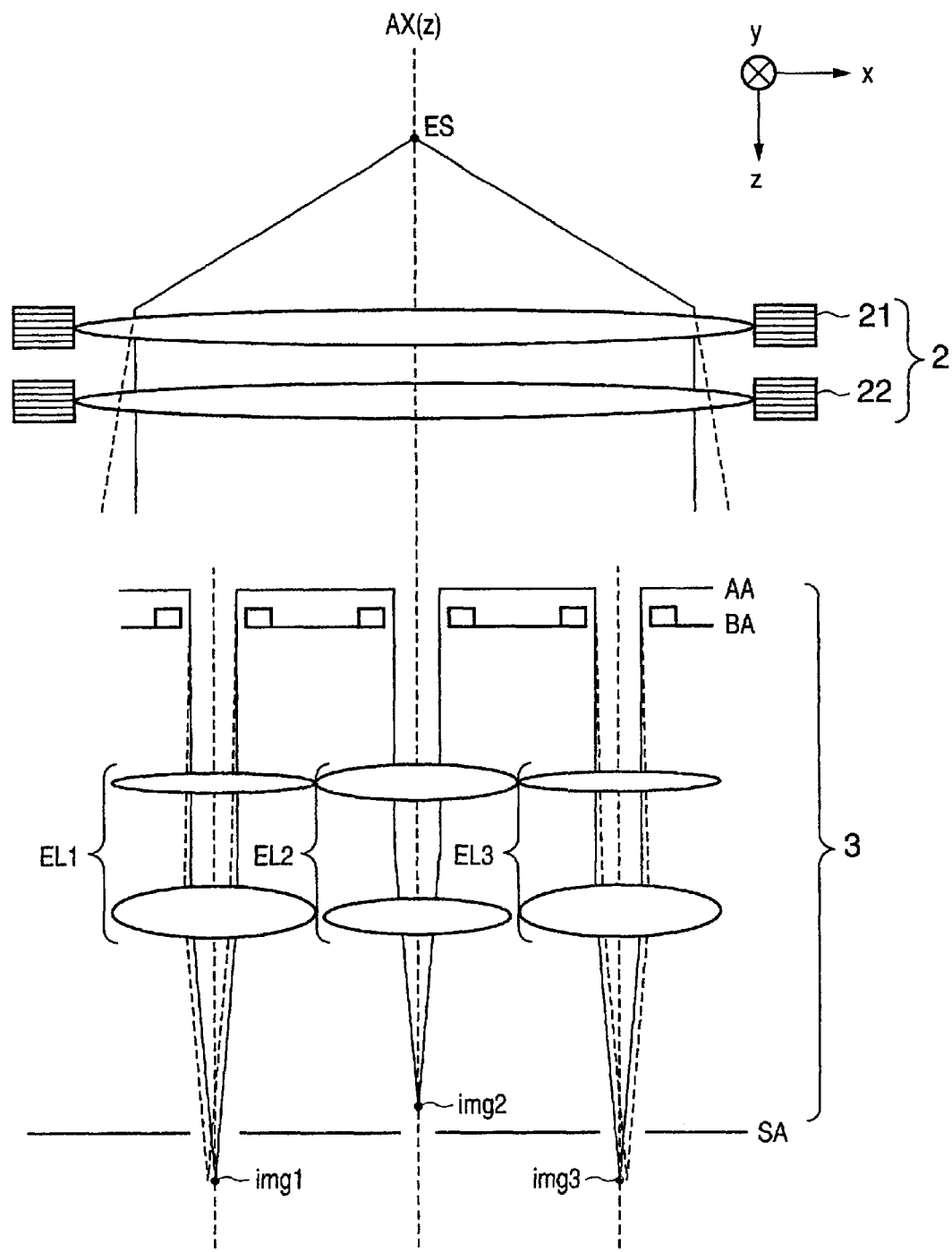
FIG. 5 is a view for explaining an aberration correcting method according to the first embodiment of the present invention.

A correcting method for curvature of field and distortion of the electron beam exposure apparatus according to this embodiment will be described with reference to FIG. 5. In FIG. 5, the same constituent elements as in FIG. 1 and FIGS. 2A and 2B are denoted by the same reference numerals, and a detailed description thereof will be omitted.

First, correction of curvature of field (an error between the image-forming position of an actual intermediate image and an ideal image-forming position on the wafer 5 in the direction of the optical axis AX (Z) of the reduction electron optical system 4) will be described.

Element electron optical systems EL1 to EL3 respectively form intermediate images img1 to img3 with the electron beams branched by the aperture array AA. During this information, the positions of the intermediate images img1 to img3 in the direction of the optical axis AX (Z) are adjusted such that they cancel the curvature of field occurring in the reduction electron optical system 4. More specifically, the electron optical powers (focal lengths) of the electron lenses that form the respective element electron optical systems EL1 to EL3 are individually adjusted, so the positions of the main surfaces of the respective element electron optical systems EL1 to EL3 are made different to correspond to the curvature of field while the synthesized electron optical powers are made uniform. As a result, the curvature of field occurring in the projection optical system is corrected, and the intermediate images img1 to img3 can be projected on the wafer 5 to have the same size.

Correction of distortion (an error between the image-forming position of an actual intermediate image and an ideal image-forming position) on the wafer 5 in a direction perpendicular to the optical axis of the reduction electron optical system 4 will be described.

When the intermediate images img1 to img3 are to be formed, their positions in a direction (X, Y) perpendicular to their optical axes AX (Z) are adjusted such that they cancel the distortion occurring in the reduction electron optical system 4. More specifically, the electron optical powers (focal lengths) of the electron lenses 21 and 22 that form the condenser lens 2 are adjusted to change the relative positional relationship between the front focal position of the condenser lens 2 and the electron source ES. Thus, the electron beams becoming incident on the aperture array AA diverge, or are focused or collimated. In other words, when the electron source ES is positioned at the front focal position of the condenser lens 2, the electron beams become incident on the aperture array AA substantially parallel to each other, as shown by the electron beams indicated by solid lines in FIG. 5. Then, the intermediate images img1 to img3 are formed on the respective optical axes of the corresponding element electron optical systems EL1 to EL3. Also, the electron optical powers of the electron lenses 21 and 22 are adjusted, so the electron source ES is positioned closer to the condenser lens 2 than the front focal position of the condenser lens 2. Then, the electron beams diverge, as shown by the electron beams indicated by broken lines in FIG. 5, to become incident on the aperture array AA. Then, when compared to the case with the electron beams indicated by the solid lines, the intermediate images img1 to img3 are formed at positions away from the optical axis AX (Z) of the condenser lens 2.

This will be described in more detail. Assume that when the electron source ES is positioned at the front focal position of the condenser lens 2 so the electron beams become incident on the aperture array AA to be substantially parallel to each other, a plurality of intermediate images are formed as shown in FIG. 6A. If the focal lengths of the electron lenses 21 and 22 are respectively adjusted so the electron source ES is positioned closer to the condenser lens 2 than the front focal position of the condenser lens 2, a plurality of intermediate images are formed as shown in FIG. 6B. Conversely, if the front focal position of the condenser lens 2 is positioned closer to the condenser lens 2 than the electron source ES, a plurality of intermediate images are formed as shown in FIG. 6C. Namely, when the electron optical powers of the electron lenses 21 and 22 are respectively adjusted, a plurality of intermediate images can be formed at such positions that they cancel distortion that may occur.

When the electron optical powers of the electron lenses 21 and 22 are to be respectively adjusted, the electron optical power of the condenser lens 2 (electron optical power synthesized by the electron lenses 21 and 22) is maintained at a constant value, thereby maintaining the intermediate images to have predetermined sizes. Thus, the intermediate images can be projected with predetermined sizes onto the wafer 5 while correcting distortion occurring in the reduction electron optical system 4.

In this embodiment, the condenser lens 2 is formed of two electron lenses. When the condenser lens 2 is formed of more than two electron lenses, distortion occurring in the projection electron optical system can be corrected by adjusting the electron optical powers of at least two electron lenses respectively.

Furthermore, when a quadrupole lens with different electron optical powers in its X-Z and Y-Z sections is added to the condenser lens 2, more various distortions can be corrected. In other words, when the relative positional relationship between the front focal positions of the respective sections including the optical axis AX of the condenser lens 2 and the electron source ES is adjusted individually, distortion not symmetrical with respect to the optical axis AX can be corrected as well.

Figure 7:
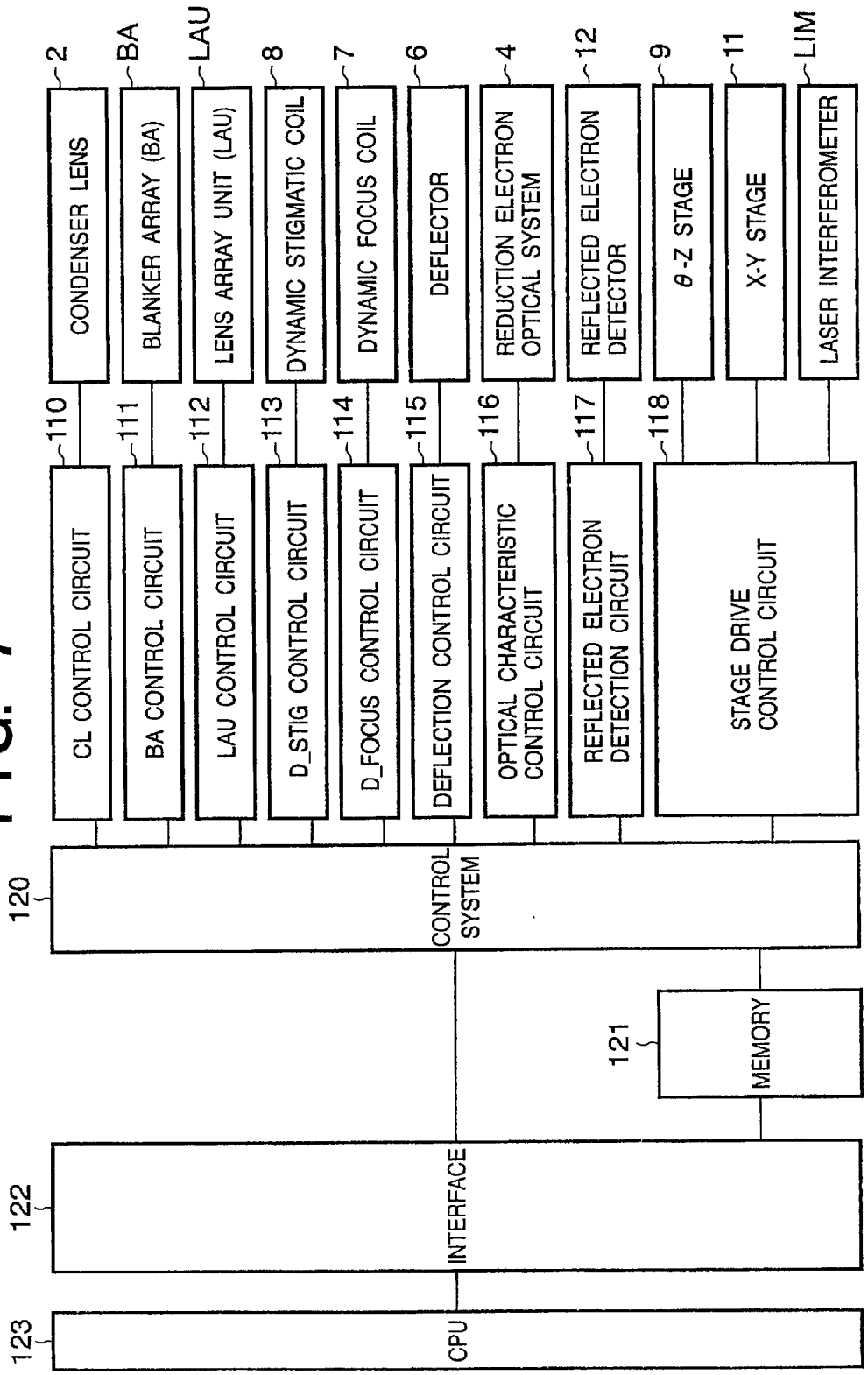
FIG. 7 is a block diagram for explaining the system configuration of the first embodiment of the present invention.

FIG. 7 shows the system configuration of this embodiment. A CL control circuit 110 controls the focal lengths of the electron lenses that form the condenser lens 2. A BA control circuit 111 controls ON/OFF of the blanking electrodes of the blanker array BA. An LAU control circuit 112 controls the focal lengths of the electron lenses that form the lens array unit LAU.

A D_STIG control circuit 113 controls the dynamic stigmatic coil 8 to control the astigmatism of the reduction electron optical system 4. A D_FOCUS control circuit 114 controls the dynamic focus coil 7 to control the focus of the reduction electron optical system 4. A deflection control circuit 115 controls the deflector 6. An optical characteristic control circuit 116 adjusts the optical characteristics (magnification, distortion) of the reduction electron optical system 4. A reflected electron detection circuit 117 calculates the amount of reflected electrons from an output signal from the reflected electron detector 12.

A stage drive control circuit 118 drives and controls the θ-Z stage 9 and drives and controls the X-Y stage 11 in cooperation with a laser interferometer LIM that detects the position of the X-Y stage 11.

A control system 120 controls the plurality of control circuits described above on the basis of data from a memory 121 which stores a drawing pattern. The control system 120 is controlled by a CPU 123, which controls the entire electron beam exposure apparatus, through an interface 122.

A method of correcting a change in positional relationship among the electron beams, which is caused by the Coulomb effect, will be described. A change in positional relationship among the electron beams, which is caused by the Coulomb effect, can be regarded as a kind of distortion of the reduction electron optical system 4. Such distortion changes in accordance with the distribution of the electron beams while drawing a pattern on the wafer 5.

Figure 9:
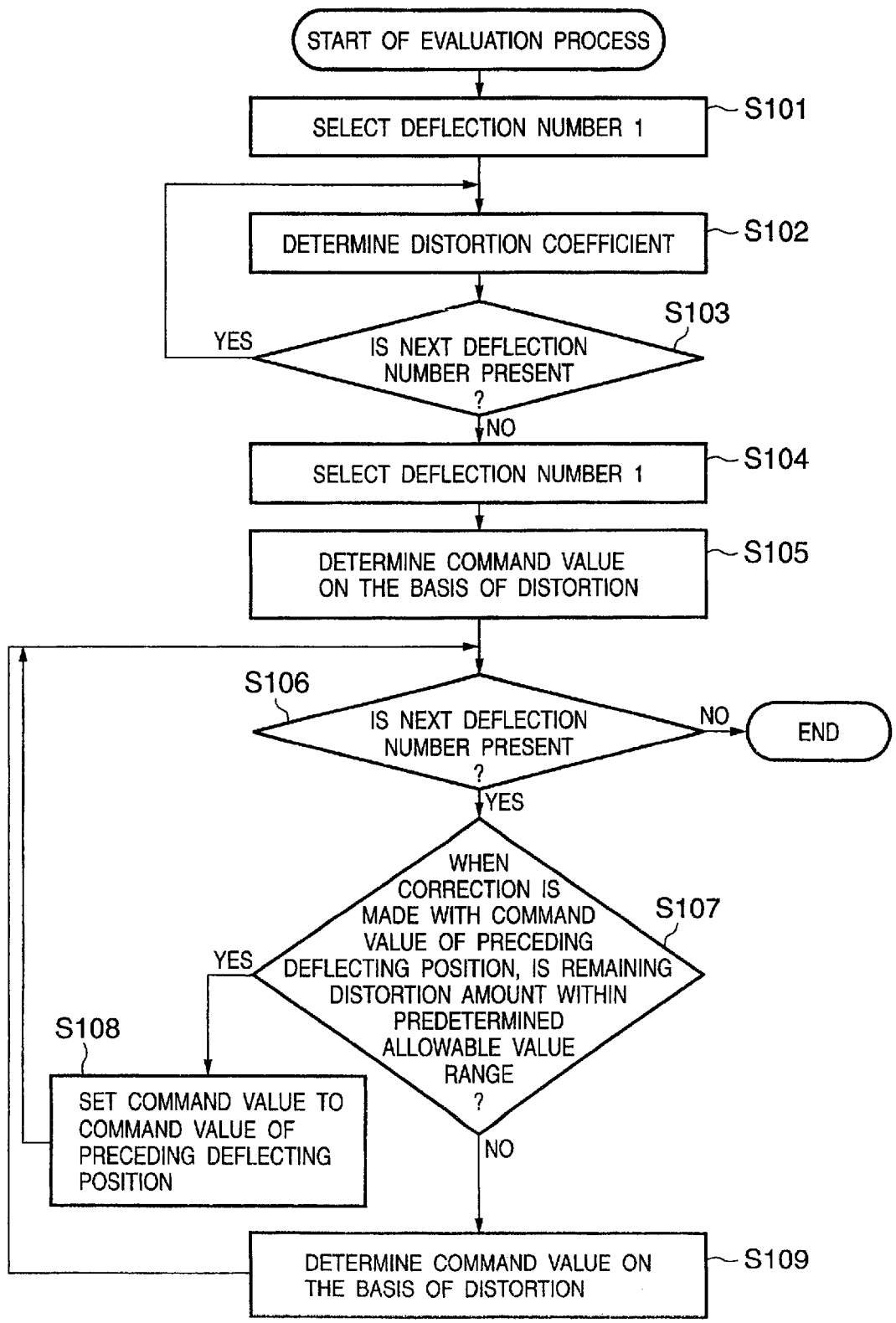
FIG. 9 is a flow chart for explaining a command value determination process according to the first embodiment of the present invention.

With the electron beam exposure apparatus according to the first embodiment, in order to correct the distortion of the reduction electron optical system 4 caused by the Coulomb effect, a command value determination process shown in FIG. 9 is performed on the basis of exposure control data (see FIG. 8) having on/off information (information indicating whether the wafer 5 is to be irradiated with the respective electron beams) of the respective electron beams for every deflecting operation.

First, in step S101, deflection number 1 is selected. The deflection number indicates the ordinal number of the current deflecting operation (number indicating which portion of the entire pattern is to be drawn). For example, deflection number 1 indicates the first deflecting operation.

In step S102, a total current I of the electron beams to irradiate the wafer 5 is obtained concerning the selected deflection number. A corresponding tertiary distortion coefficient D is determined in accordance with equation (1) and stored in the memory 121.

$$D = k0 \times I^2$$

where k0 is a constant determined by experiments or the like.

In step S103, whether the next deflection number is present is checked. If YES in step S103, the next deflection number is selected, and the flow returns to step S102. If NO in step S103, the flow advances to the next step S104.

In step S104, deflection number 1 is selected.

In step S105, a command value to be sent to the CL control circuit 110 is determined in order to correct distortion determined by the distortion coefficient D concerning the selected deflection number 1 and stored in the memory 121, and is stored in the memory 121. During exposure operation, the CL control circuit 110 adjusts the electron optical powers of the two electron lenses 21 and 22 in accordance with the command value.

In step S106, whether the next deflection number is present is checked. If YES in step S106, the next deflection number is selected, and the flow advances to step S107. If NO in step S106, the series of processes are ended.

In step S107, it is checked whether the amount of distortion, which remains when the distortion determined by the distortion coefficient D concerning the selected deflection number and stored in the memory 121 is corrected by the command value to be sent to the CL control circuit 110 with the deflecting operation of the deflection number that precedes by one, falls within a predetermined allowable value range. If YES in step S107, the flow advances to step S108. If NO in step S107, the flow advances to step S109.

In step S108, a command value concerning the selected deflection number and to be sent to the CL control circuit 110 is set to be the same command value as that in the deflection operation of the deflection number that precedes by one, and is stored in the memory 121. The flow then advances to step S106.

In step S109, a command value (in accordance with which the CL control circuit 110 adjusts the electron optical powers of the two electron lenses 21 and 22 during exposure operation), which is to be sent to the CL control circuit 110 in order to correct the distortion concerning the selected deflection number and determined by the stored distortion coefficient D, is determined and stored in the memory 121. The flow then advances to step S106. The command values determined in steps S108 and S109 may be added to the exposure control data.

The exposure operation of the electron beam exposure apparatus according to this embodiment will be described with reference to FIG. 7. The control system 120 causes the deflection control circuit 115 to control the deflector 6 on the basis of the exposure control data stored in the memory 121, to deflect the plurality of electron beams. Also, in order to correct the distortion caused by the Coulomb effect, the control system 120 causes the CL control circuit 110 to control the electron optical powers of the two electron lenses 21 and 22 on the basis of the command value stored in the memory 121, to correct the distortion. Simultaneously, the control system 120 causes the BA control circuit 111 to individually turn on/off the blanking electrodes of the blanker array BA in accordance with exposure control data (i.e., in accordance with a pattern to be drawn on the wafer 5). At this time, the X-Y stage 11 moves continuously in the Y direction. Hence, the deflector 6 deflects the plurality of electron beams so as to follow the movement of the X-Y stage 11.

Figure 10:
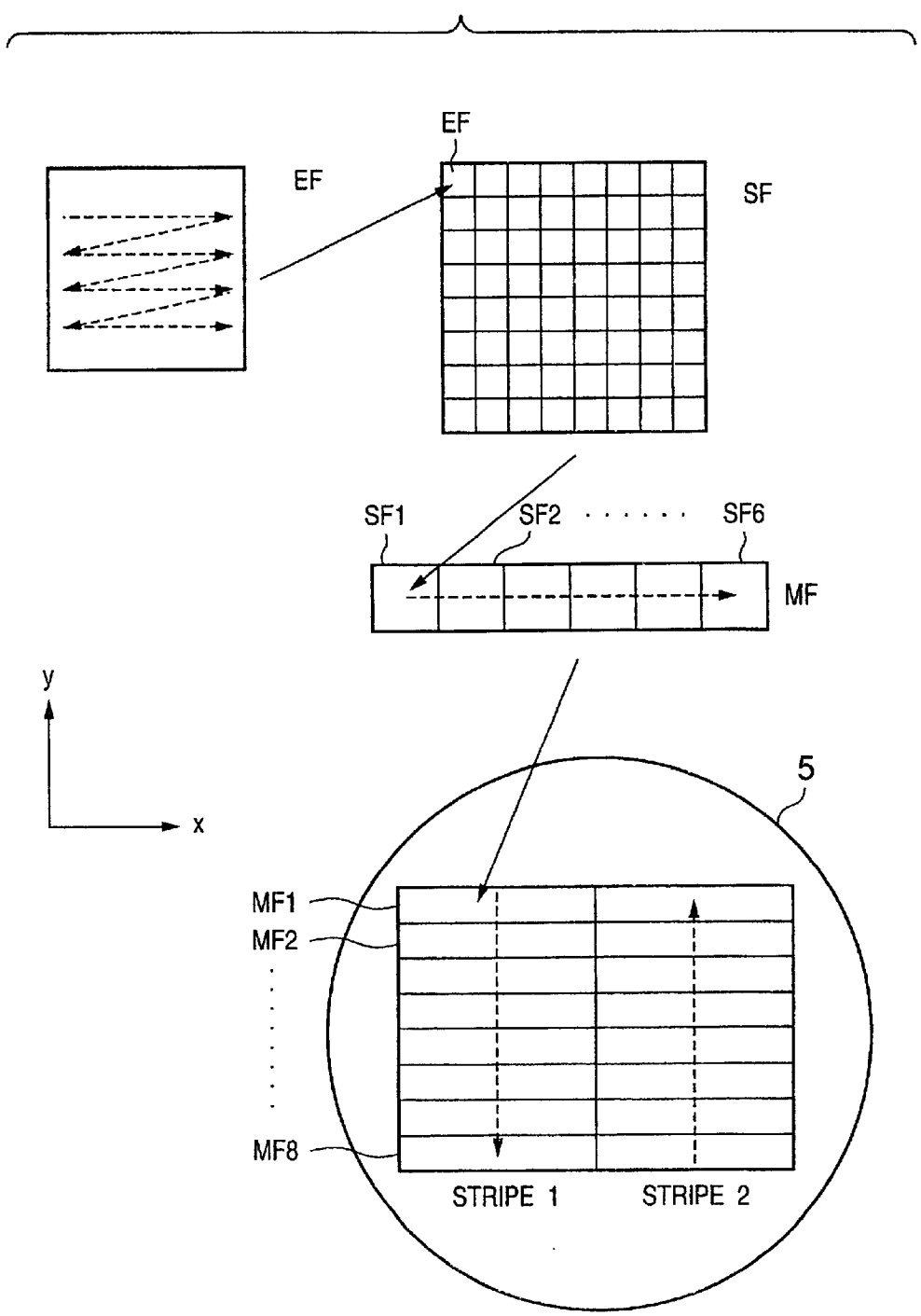
FIG. 10 is a view for explaining an exposure region.

Through the continuous deflecting operations, each electron beam draws a pattern on a corresponding element exposure region (EF) on the wafer 5 while scanning it, as shown in FIG. 10. Patterns are simultaneously drawn on a plurality of element exposure regions (EF) corresponding to the plurality of electron beams. This means that a pattern is drawn on one subfield (SF) formed of the plurality of element exposure regions (EF).

After drawing a pattern on one subfield (SF1), the control system 120 instructs the deflection control circuit 115 to deflect the plurality of electron beams by the deflector 6 in a direction (X direction) perpendicular to the stage scanning direction (Y direction), so a pattern is drawn on next subfield (SF2). At this time, since the subfields are switched by deflection, the aberrations with which the respective electron beams are reduced and projected through the reduction electron optical system 4 also change. Hence, the control system 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberrations. Thereafter, as described above, the plurality of electron beams draw patterns on the corresponding plurality of element exposure regions (EF), thereby drawing a pattern on the second subfield (SF2). In this manner, as shown in FIG. 10, patterns are sequentially drawn on subfields (SF1 to SF6) that line up in a direction (X direction) perpendicular to the stage scanning direction (Y direction). Thus, a pattern is drawn on a main field (MF) constituted by the subfields (SF1 to SF6).

After a pattern is drawn on the first main field (MF1) shown in FIG. 10, the control system 120 instructs the deflection control circuit 115 to sequentially deflect the plurality of electron beams toward main fields (MF2, MF3, MF4, . . . ) that line up in the stage scanning direction (Y direction), and to draw patterns there. As a result, as shown in FIG. 10, a pattern is drawn on a stripe (STRIPE1) constituted by the main fields (MF2, MF3, MF4, . . . .) Subsequently, the control system 120 causes the X-Y stage 11 to step in the X direction, to draw a pattern on the next stripe (STRIPE2).

[Second Embodiment]

Figure 11:
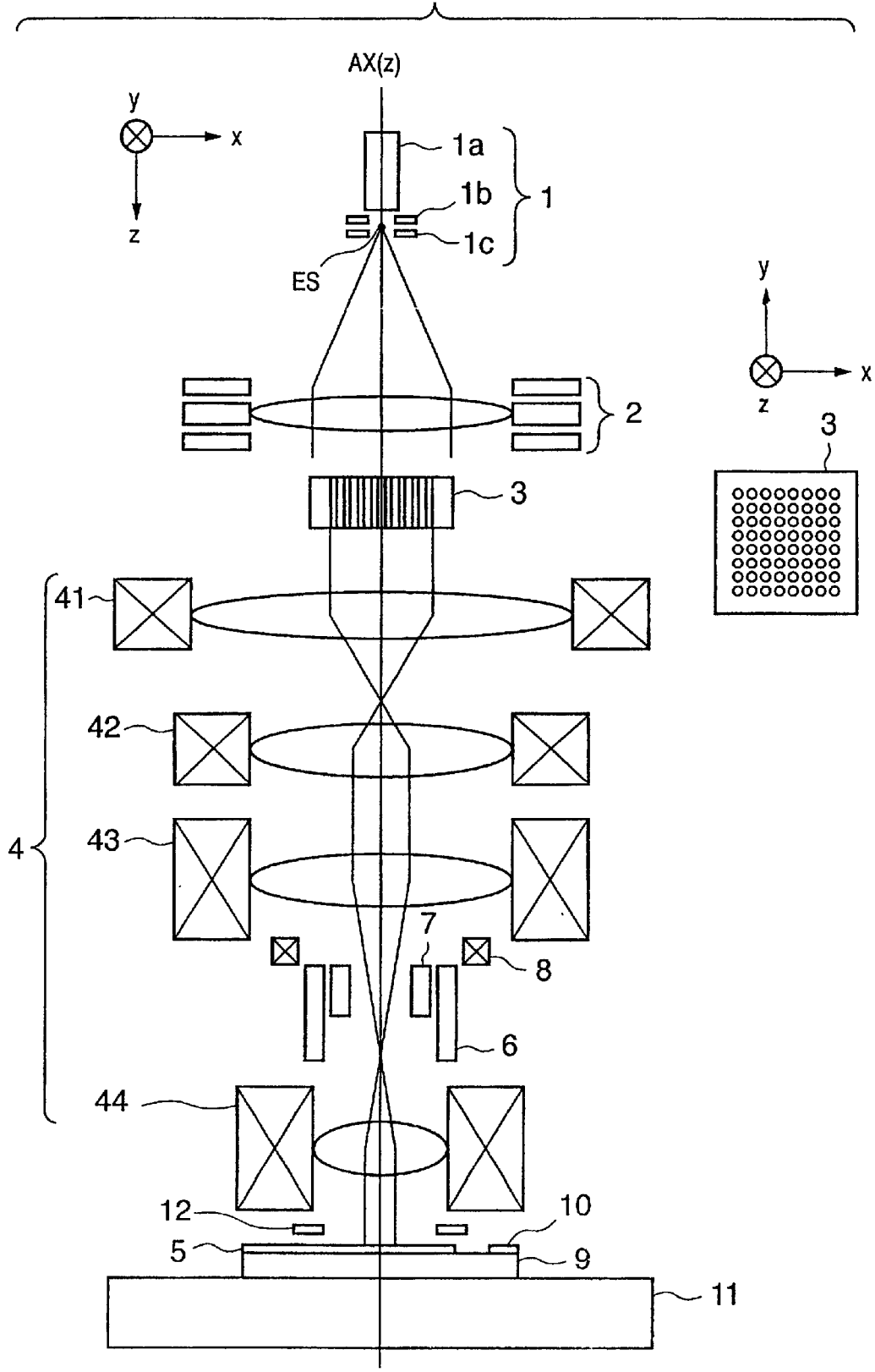
FIG. 11 is a view schematically showing the main part of an electron beam exposure apparatus according to the second embodiment of the present invention.

FIG. 11 is a schematic view showing the main part of an electron beam exposure apparatus according to the second embodiment of the present invention. The same constituent elements as in the electron beam exposure apparatus of the first embodiment described above shown in FIG. 1 are denoted by the same reference numerals, and a detailed description thereof will be omitted.

In the second embodiment, a condenser lens 2 is formed of an electron lens comprising three aperture electrodes. Although the condenser lens 2 does not include unipotential lenses 21 and 22, which constitute one characteristic feature of the first embodiment, it may include them in the second embodiment as well.

An element electron optical system array 3 used in the electron beam exposure apparatus according to the second embodiment will be described with reference to FIGS. 12A and 12B. The same constituent elements as in the element electron optical system array 3 of the first embodiment described above shown in FIG. 2 are denoted by the same reference numerals, and a detailed description thereof will be omitted.

The element electron optical system array 3 according to the second embodiment is comprised of an aperture array AA, X-blanker array BAX, Y-blanker array BAY, element electron optical system array unit LAU, and stopper array SA.

Figure 12A:
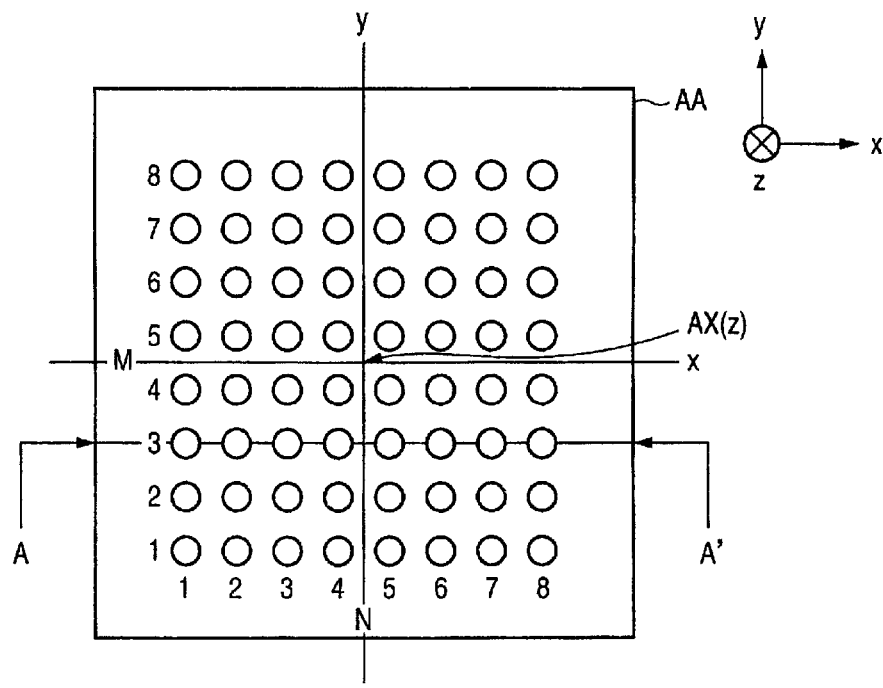
FIGS. 12A and 12B are views for explaining an element electron optical system array according to the second embodiment of the present invention.
Figure 12B:
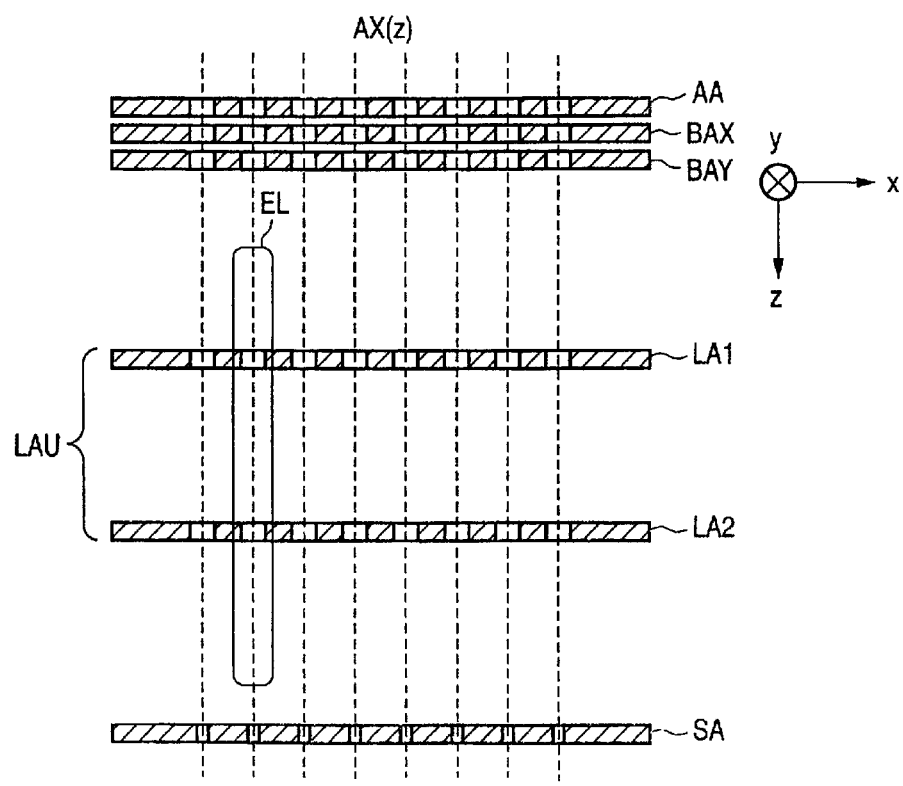

FIG. 12A is a view of the element electron optical system array 3 seen from the electron gun 1 side, and FIG. 12B is a sectional view taken along the line A–A' of FIG. 12A. The arrangement and function of the aperture array AA are identical to those of the first embodiment described above (FIGS. 2A and 2B), and a detailed description thereof will accordingly be omitted.

Figure 13:
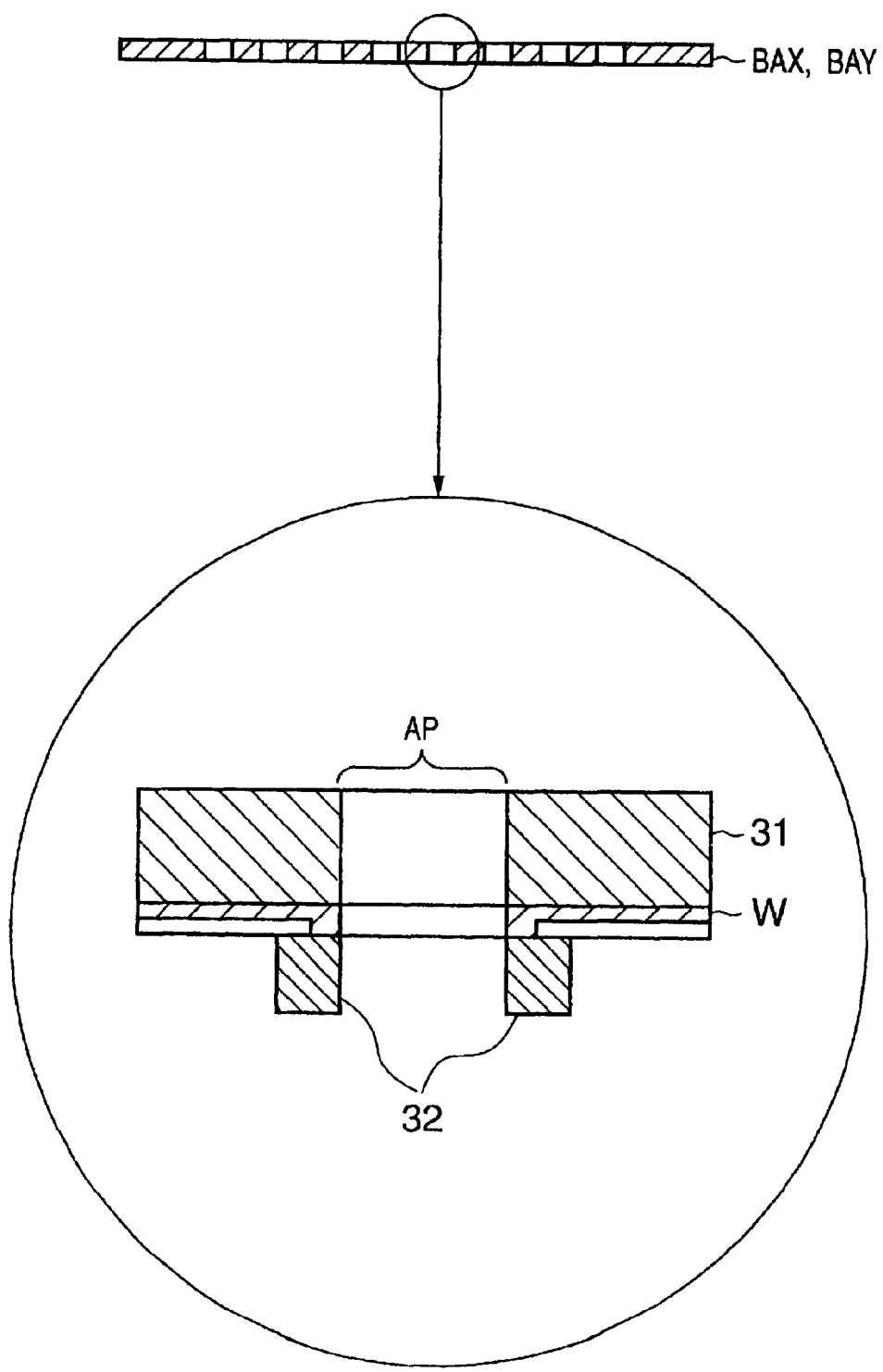
FIG. 13 is a view for explaining one deflector of an X-blanker array BAX or Y-blanker array BAY according to the second embodiment of the present invention.
Figure 14A:
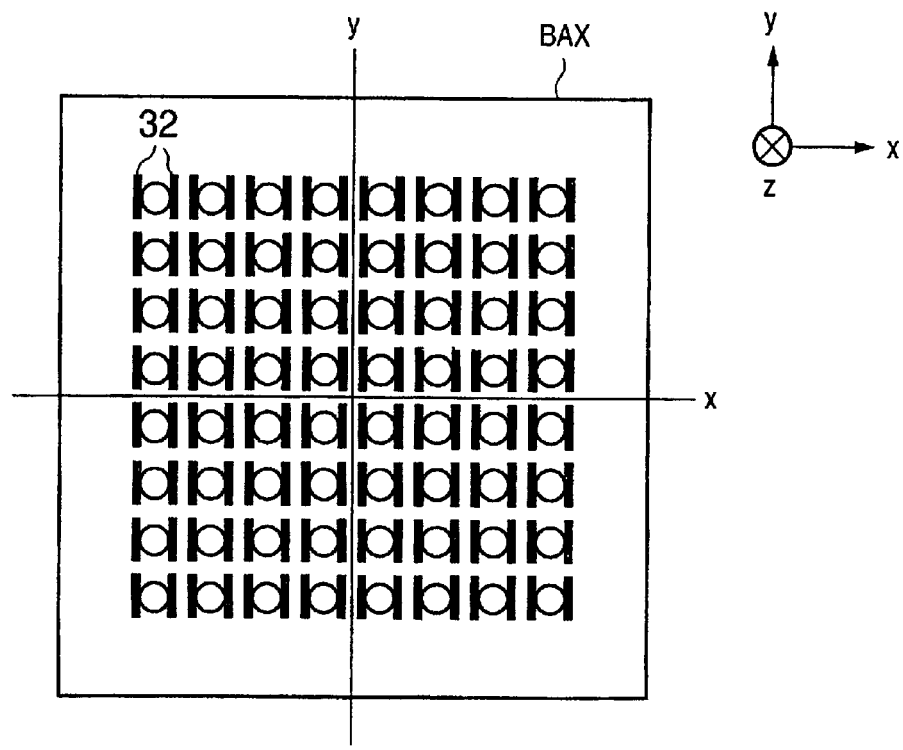
FIGS. 14A and 14B are views for explaining the X-blanker array BAX and Y-blanker array BAY, respectively, according to the second embodiment of the present invention.
Figure 14B:
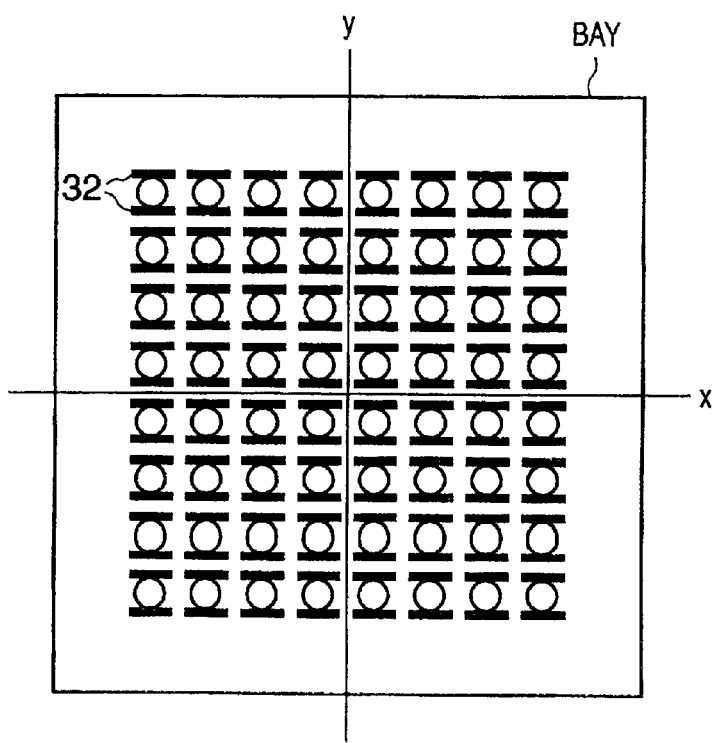

Each of the X- and Y-blanker arrays BAX and BAY is obtained by forming a plurality of deflectors, that individually deflect the plurality of electron beams branched by the aperture array AA, on one board. FIG. 13 shows one of these deflectors in detail. A board 31 has apertures AP. Blanking electrodes 32 each formed of a pair of electrodes sandwiching one aperture AP and having a deflecting function, and wiring lines (W) for individually turning on/off the blanking electrodes 32 are formed on the board 31. As shown in FIG. 14A, each pair of all the blanking electrodes 32 of the X-blanker array BAX oppose each other in the X direction, and deflect the electron beams from the aperture array AA in the X direction. As shown in FIG. 14B, each pair of all the blanking electrodes 32 of the Y-blanker array BAY oppose each other in the Y direction, and deflect the electron beams from the aperture array AA in the Y direction.

The arrangement and function of the element electron optical system array unit LAU are identical to those in the first embodiment described above (FIG. 4), and a detailed description thereof will accordingly be omitted.

Similarly to the aperture array AA, the stopper array SA is obtained by forming a plurality of apertures in a board. When deflection amounts aimed at shielding are applied to the electron beams by using at least one of the X- and Y-blanker arrays BAX and BAY, the electron beams move to the outside of the corresponding apertures of the stopper array SA and are shielded by the stopper array SA, so they do not become incident on a wafer 5.

Figure 15:
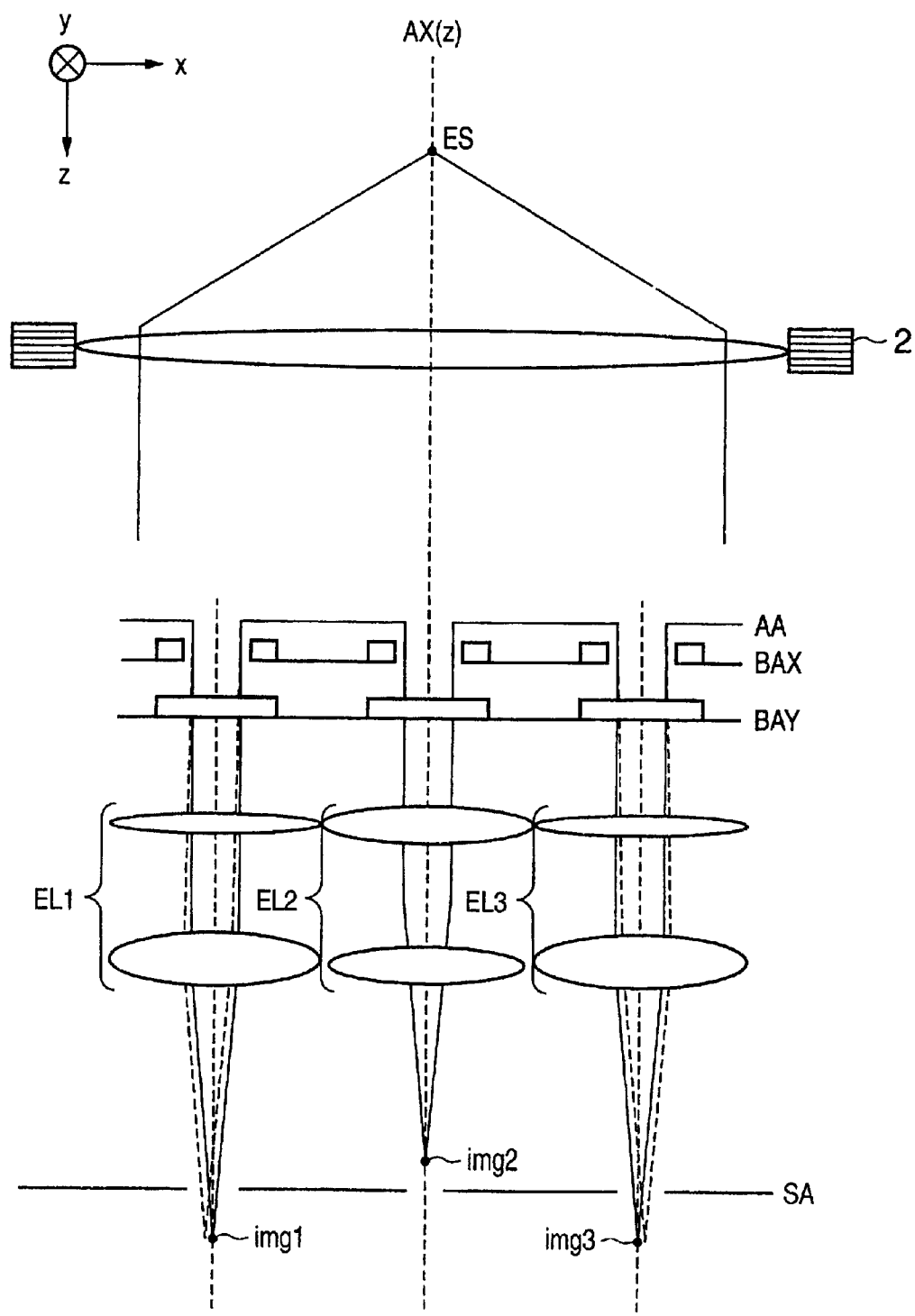
FIG. 15 is a view for explaining an aberration correcting method according to the second embodiment of the present invention.

A correction method for curvature of field and distortion in the electron beam exposure apparatus according to the second embodiment will be described in detail with reference to FIG. 15. In FIG. 15, the same constituent elements as in FIGS. 11, 12A, and 12B are denoted by the same reference numerals, and a detailed description thereof will be omitted. The same constituent elements as in the first embodiment of FIG. 5 described above are denoted by the same reference numerals, and a detailed description thereof will be omitted.

A correcting method for curvature of field in the second embodiment is the same as in the first embodiment described above, and a detailed description thereof will accordingly be omitted. A description will be made on correction of distortion (an error between the image-forming position of an actual intermediate image and an ideal image-forming position on the wafer 5 in a direction perpendicular to the optical axis of a reduction electron optical system 4).

When intermediate images img1 to img3 are to be formed, their positions in directions (X, Y) perpendicular to their optical axes AX (Z) are adjusted such that they cancel the distortion occurring in the reduction electron optical system 4. More specifically, the deflection amounts to be applied to the electron beams are individually adjusted by the X- and Y-blanker arrays BAX and BAY. If the electron beams are not deflected by the X- and Y-blanker arrays BAX and BAY, the intermediate images img1 to img3 are formed on the respective optical axes of corresponding element electron optical systems EL1 to EL3, as shown by the electron beams indicated by solid lines in FIG. 15. If the electron beams are deflected by the X-blanker array BAX to be away from the optical axes AX in accordance with distances of the electron beams from the optical axes AX, the intermediate images img1 to img3 are formed at positions away from the optical axis X (Z) of the condenser lens 2, as shown by the electron beams indicated by broken lines in FIG. 15, when compared to the intermediate images img1 to img3 formed by the electron beams indicated by the solid lines.

Figure 16C:
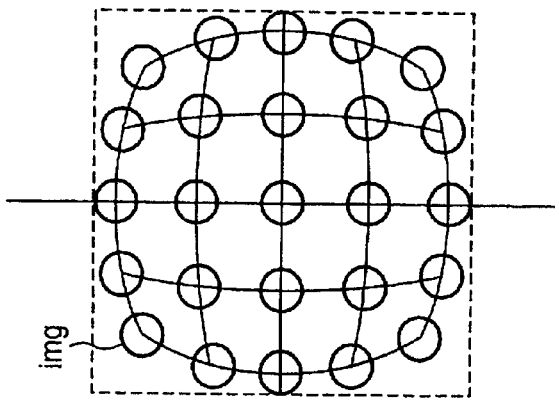
FIGS. 16A to 16C are views for explaining position adjustment of an intermediate image according to the second embodiment of the present invention.
Figure 16B:
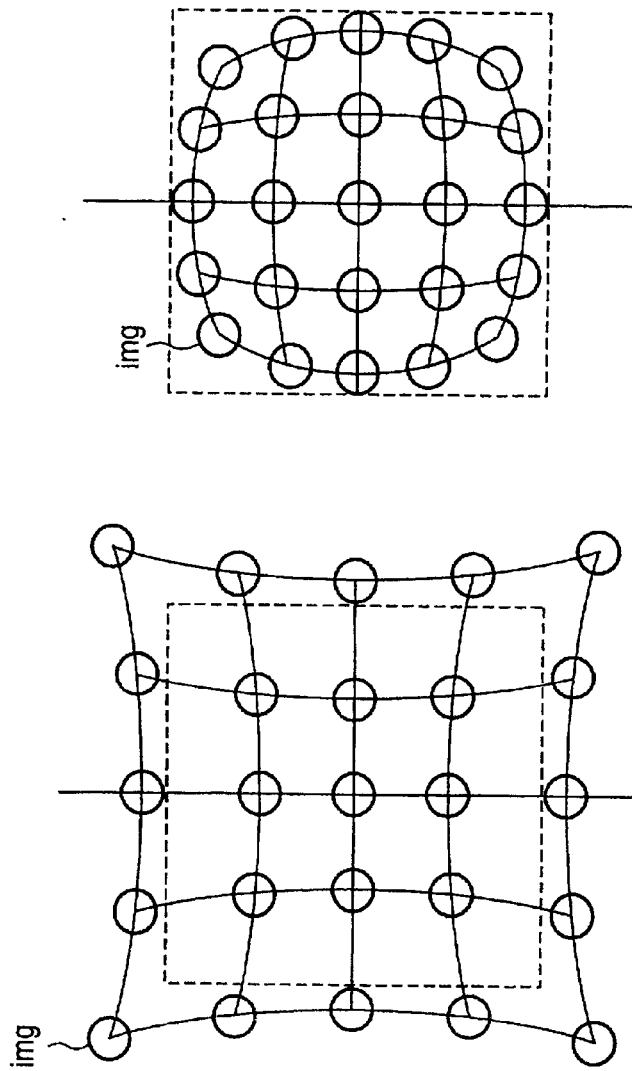
Figure 16A:
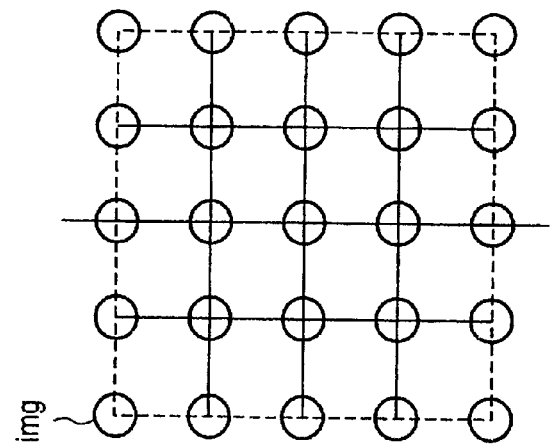

This will be described in more detail. Assume that when the electron beams are not deflected by the X- and Y-blanker arrays BAX and BAY, a plurality of intermediate images are formed as shown in FIG. 16A. If the electron beams are deflected by the X- and Y-blanker arrays BAX and BAY to be away from the optical axes AX in accordance with the distances of the electron beams from the optical axes AX, a plurality of intermediate images are formed as shown in FIG. 16B. Conversely, if the electron beams are deflected by the X- and Y-blanker arrays BAX and BAY to come close to the optical axes AX in accordance with the positions of the electron beams with respect to the optical axes AX, a plurality of intermediate images are formed as shown in FIG. 16C. Namely, when the deflection amounts to be applied to the electron beams are individually adjusted by the X- and Y-blanker arrays BAX and BAY, a plurality of intermediate images can be formed at such positions that distortion to occur can be canceled.

Figure 17:
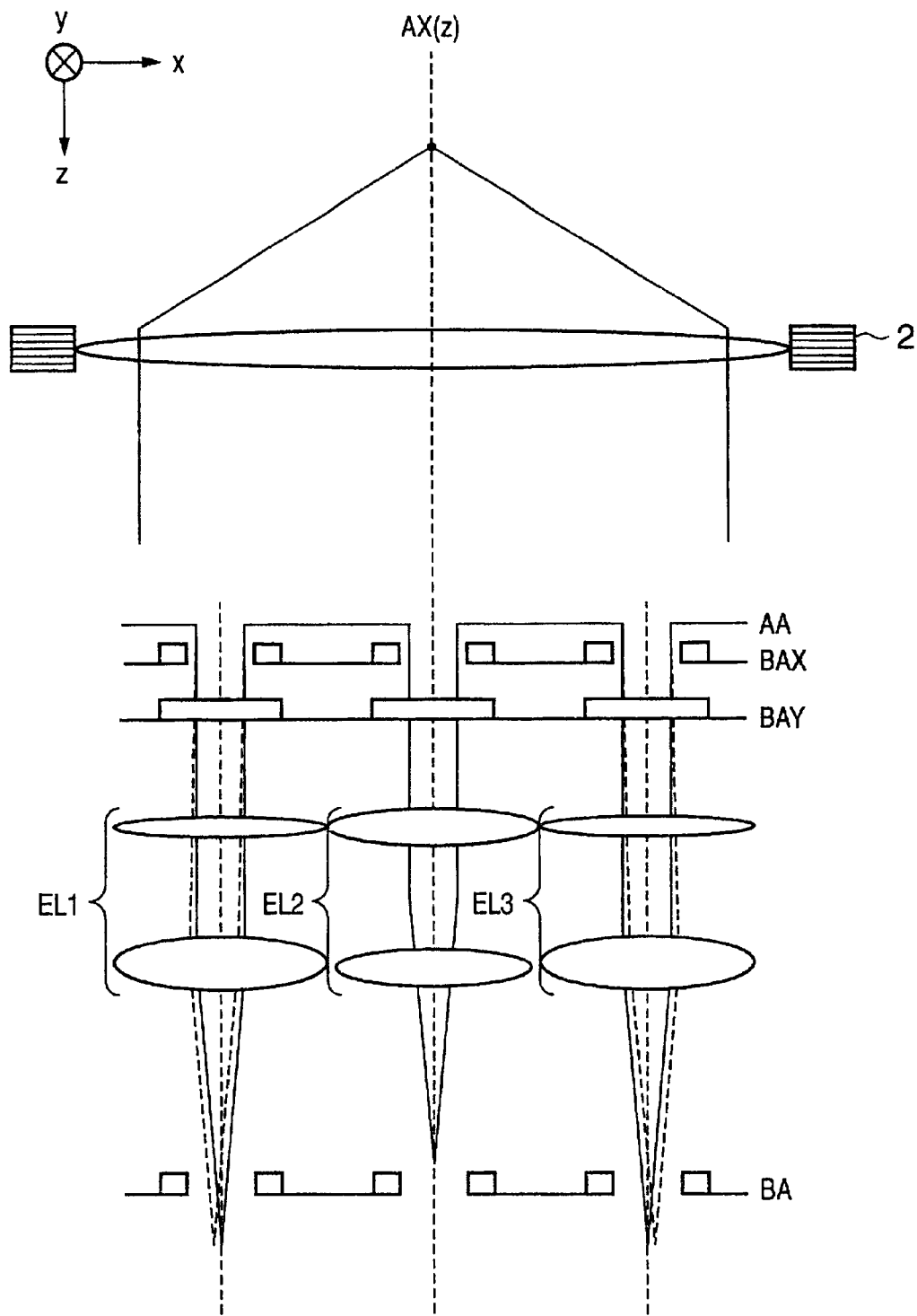
FIG. 17 is a view for explaining a modification of the second embodiment of the present invention.

According to the second embodiment, assume that correcting deflection amounts are to be individually applied to the respective electron beams by the X- and Y-blanker arrays BAX and BAY in order to correct distortion, while projection of all or some intermediate images on the wafer surface is to be shielded. In this case, shielding deflection amounts are applied to the electron beams by those blanking electrodes of at least one of the X- and Y-blanker arrays BAX and BAY, which correspond to the intermediate image to be shielded. Alternatively, correction of distortion and shielding of the electron beams may be controlled by different blanker arrays. In the example shown in FIG. 17, an exclusive shielding blanker array BA is positioned to replace the stopper array SA of this embodiment. In the example shown in FIG. 17, a stopper for shielding the electron beams deflected by the exclusive shielding blanker array BA is formed at the pupil of the reduction electron optical system 4.

Figure 18:
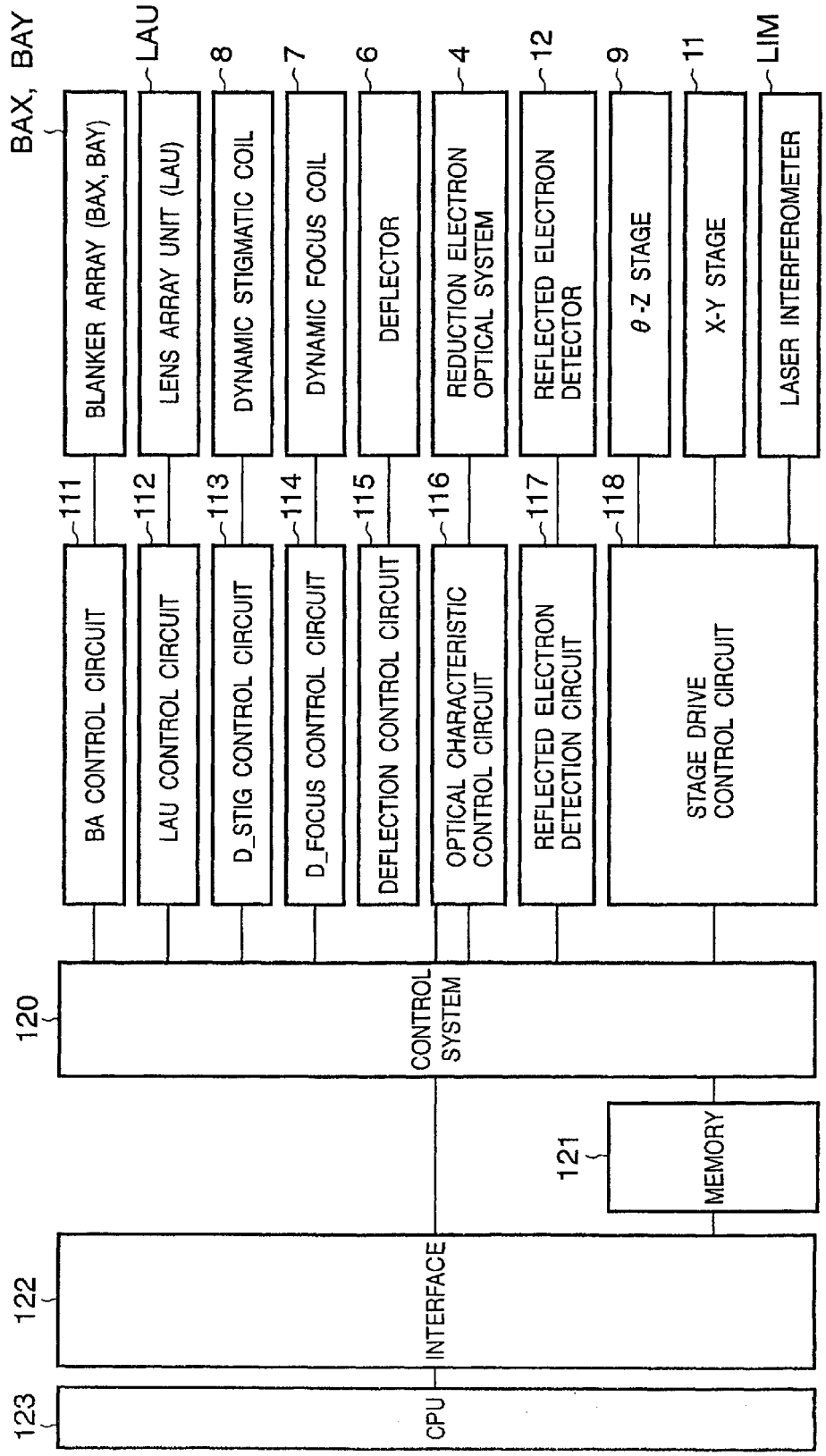
FIG. 18 is a block diagram for explaining the system configuration of the second embodiment of the present invention.

FIG. 18 shows the system configuration of the second embodiment of the present invention. Assume that correcting deflection amounts are to be applied individually to the respective electron beams by the X- and Y-blanker arrays BAX and BAY in order to correct distortion caused by the Coulomb effect, while projection of all or some intermediate images on the wafer surface is to be shielded. In this case, a BA control circuit 111 applies shielding deflection amounts to the electron beams through those blanking electrodes of at least one of the X- and Y-blanker arrays BAX and BAY which correspond to the intermediate image to be shielded.

In FIG. 18, other constituent elements, i.e., the same constituent elements as in the system configuration of the first embodiment of FIG. 7 described above are denoted by the same reference numerals, and a detailed description thereof will be omitted.

The system configuration of the second embodiment of the present invention shown in FIG. 18 and the system configuration of the first embodiment of the present invention shown in FIG. 7 will be compared with each other. The system configuration of the second embodiment does not have a CL control circuit for controlling the focal length of the condenser lens 2. This is because, in the second embodiment, distortion caused by the Coulomb effect is corrected not by controlling the focal length of the condenser lens 2 but by controlling the deflection amounts of the X- and Y-blanker arrays BAX and BAY, as described above. Alternatively, both the condenser lens 2 of the first embodiment and the X- and Y-blanker arrays BAX and BAY of the second embodiment may be employed to correct the distortion caused by the Coulomb effect. Also, a CL control circuit for controlling the focal length of the condenser lens 2 may be formed for a purpose other than correction of the distortion caused by the Coulomb effect.

Figure 19:
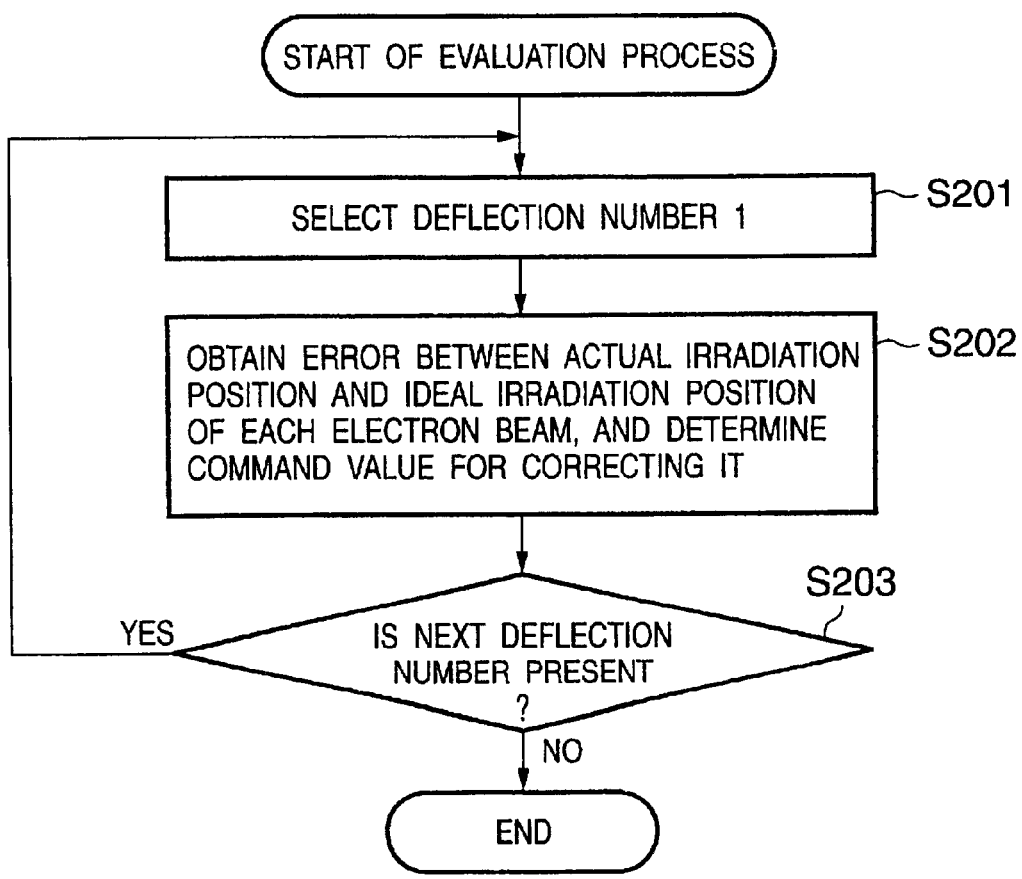
FIG. 19 is a flow chart for explaining a command value determination process according to the second embodiment of the present invention.

With the electron beam exposure apparatus according to the second embodiment, in order to correct the distortion caused by the Coulomb effect, a command value determination process shown in FIG. 19 is performed on the basis of exposure control data (see FIG. 8) having on/off information (information indicating whether the wafer 5 is to be irradiated with each electron beam) of the respective electron beams for every deflecting operation.

Note that the element electron optical system array 3 forms N×M electron beams.

First, in step S201, deflection number 1 is selected. The deflection number indicates the place of the current deflecting operation (number indicating what portion of the entire pattern is to be drawn). For example, deflection number 1 indicates the first deflecting operation.

In step S202, an error ($\delta x(p, q)$, $\delta y(p, q)$) between an actual irradiation position and an ideal irradiation position of each electron beam (p, q), which is caused depending on the distribution of the electron beams that irradiate the wafer 5, is obtained in accordance with equation (2) concerning the selected deflection number. A command value to be sent to the BA control circuit 111 for controlling the deflecting amounts of the X- and Y-blanker arrays BAX and BAY in order to correct this error is determined, and is stored in a memory 121.

$$\delta x(p, q) = \sum_{j=1}^{M} \sum_{i=1}^{N} (k1 \times \sigma(p, q) \times \sigma(i, j) \times (x(i, j) - x(p, q))/d(i, j, p, q)/(d(i, j, p, q)^2 + k2^2)^{3/2})$$

$$\delta y(p, q) = \sum_{j=1}^{M} \sum_{i=1}^{N} (k1 \times \sigma(p, q) \times \sigma(i, j) \times (y(i, j) - y(p, q))/d(i, j, p, q)/(d(i, j, p, q)^2 + k2^2)^{3/2})$$

where (x(p, q), y(p, q)) is the ideal irradiation position of an electron beam (p, q), $\sigma(p, q)$ is a current value (0 during non-irradiation) during irradiation, and k1 and k2 are constants obtained by experiments or the like.

Also, $$d(i, j, p, q) = \sqrt{((x(i, j) - x(p, q))^2 + (y(i, j) - y(p, q))^2)}.$$

In step S203, whether the next deflection number is present is checked. If YES in step S203, the next deflection number is selected, and the flow returns to step S202. If NO in step S203, the series of processes are ended.

The exposure operation of the electron beam exposure apparatus according to the second embodiment will be described with reference to FIG. 18. A control system 120 causes a deflection control circuit 115 to control a deflector 6 on the basis of exposure control data stored in the memory 121, to deflect the plurality of electron beams. Also, in order to correct the distortion caused by the Coulomb effect, the control system 120 applies correcting deflection amounts to the respective electron beams by both the X- and Y-blanker arrays BAX and BAY on the basis of the command value stored in the memory 121, and applies shielding deflection amounts to the electron beams by the blanking electrodes of both or one of the X- and Y-blanker arrays BAX and BAY in accordance with a pattern to be drawn on the wafer 5. At this time, an X-Y stage 11 moves continuously in the Y direction. Hence, the deflector 6 deflects the plurality of electron beams so as to follow the movement of the X-Y stage 11.

Through the deflecting operations, each electron beam draws a pattern on a corresponding element exposure region (EF) on the wafer 5 while scanning it, as shown in FIG. 10. Patterns are simultaneously drawn on a plurality of element exposure regions (EF) corresponding to the plurality of electron beams. This means that a pattern is drawn on one subfield (SF) formed of the plurality of element exposure regions (EF).

Operation of drawing a pattern on the main field while sequentially drawing patterns on subfields (SF1 to SF6) by deflection, and operation of drawing a pattern on a stripe (STRIPE) while sequentially drawing patterns on the main fields are the same as in the first embodiment (FIG. 7) described above, and a detailed description thereof will be omitted.

[Third Embodiment]

As the third embodiment of the present invention, a device manufacturing method using the electron beam exposure apparatus according to the first or second embodiment of the present invention will be described.

Figure 20:
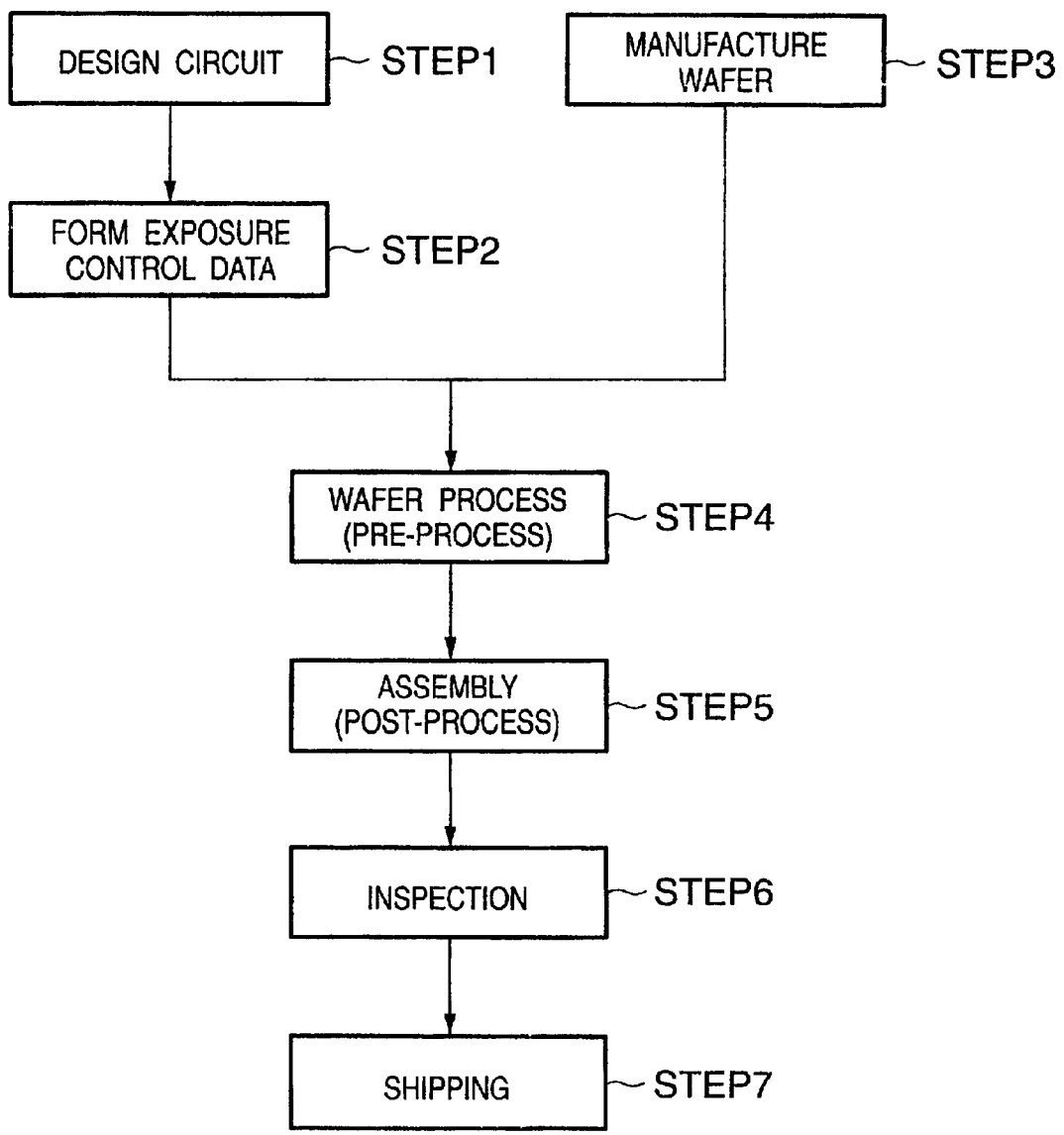
FIG. 20 is a flow chart for explaining a microdevice manufacturing flow according to the third embodiment of the present invention.

FIG. 20 shows the flow of manufacture of a microdevice (e.g., a semiconductor chip such as an IC or LSI, a liquid crystal panel, a CCD, a thin film magnetic head, a micromachine, or the like). In step 1 (design circuit), a semiconductor device circuit is designed. In step 2 (form exposure control data), the exposure control data of the exposure apparatus is formed on the basis of the designed circuit pattern. In step 3 (manufacture wafer), a wafer is manufactured by using a material such as silicon. In step 4 (wafer process), called a pre-process, an actual circuit is formed on the wafer by lithography using the exposure apparatus, to which the prepared exposure control data has been input, and the wafer. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed, and shipped (step 7).

Figure 21:
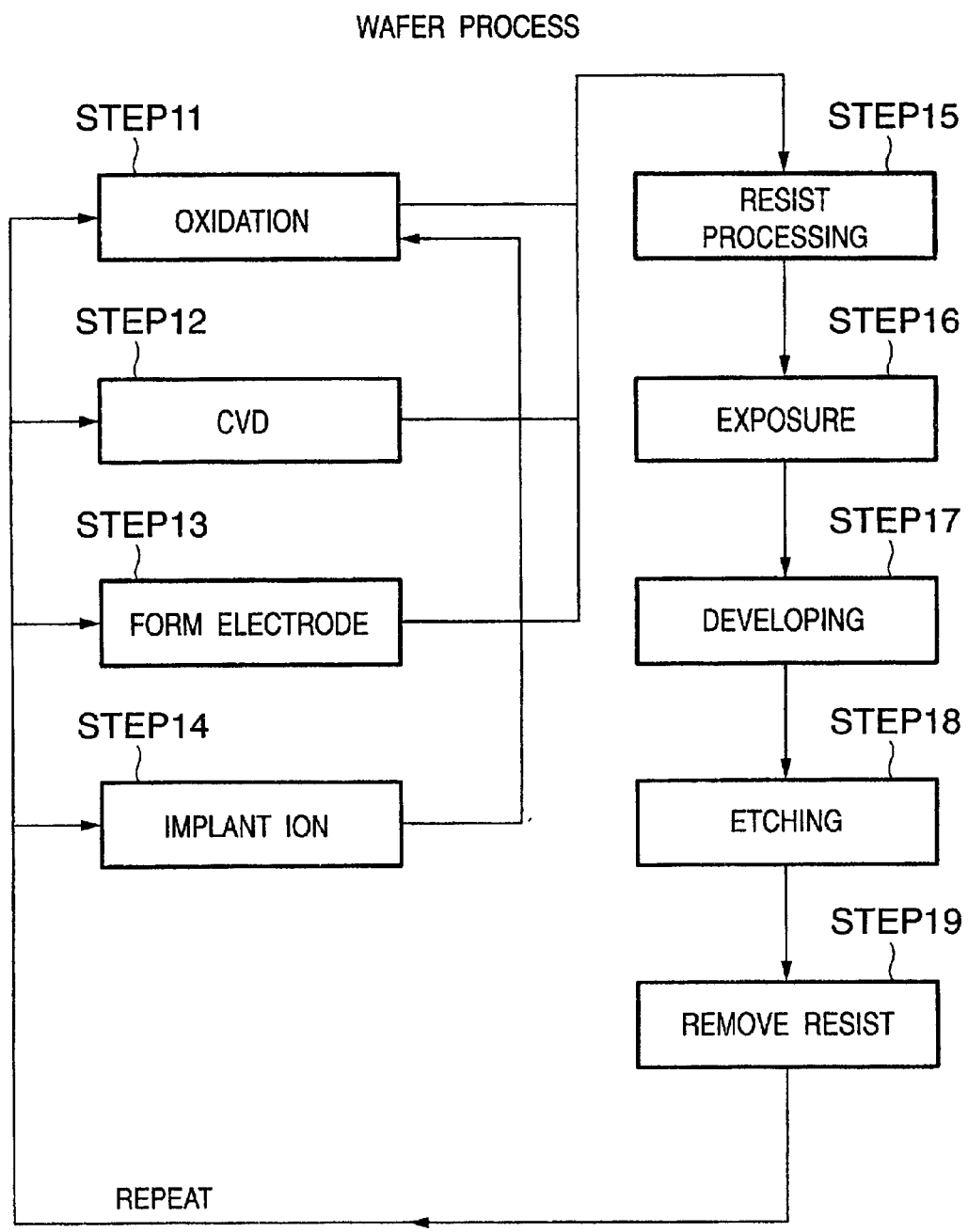
FIG. 21 is a flow chart for explaining a wafer process according to the third embodiment of the present invention.
Figure 22A:
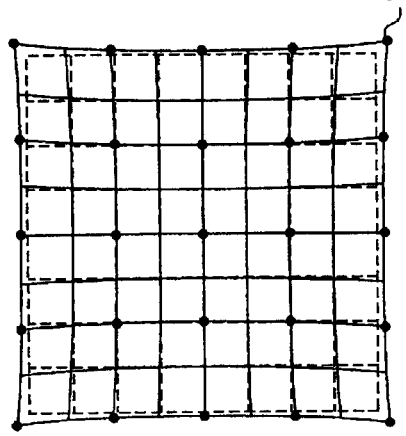
FIGS. 22A to 22C are views for explaining a change in positional relationship among charged particle beams which is caused by the Coulomb effect according to the present invention.
Figure 22B:
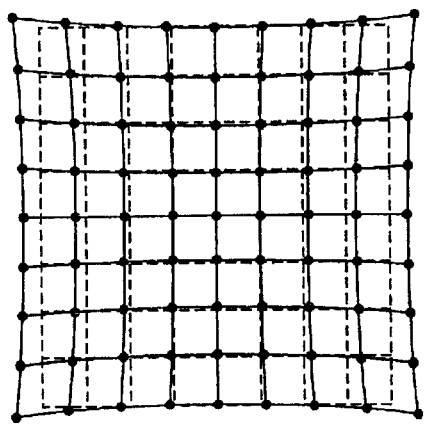
Figure 22C:
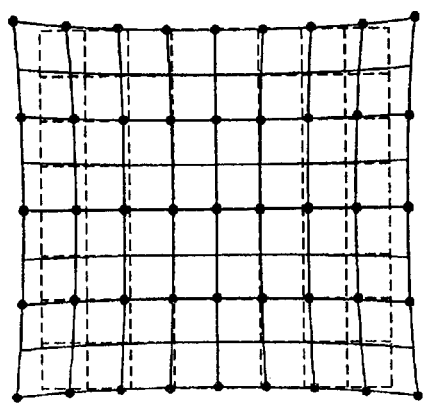

FIG. 21 shows the detailed flow of the wafer process. In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus exposes the circuit pattern to the wafer. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer.

With the manufacturing method according to this embodiment, a highly integrated semiconductor device, which is conventionally difficult to manufacture, can be manufactured at a low cost.

With the charged particle beam exposure apparatus and method according to the present invention, a change in positional relationship among charged particle beams, which occurs in accordance with a pattern to be drawn on the substrate, is corrected, and drawing with higher precision than with the prior art can be realized.

With the device manufacturing method according to the present invention, a device with higher precision than with the prior art can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. A charged particle beam exposure apparatus for drawing a pattern on a substrate by using a plurality of charged particle beams, the apparatus comprising:

an irradiation system which includes a condenser lens and irradiates the plurality of charged particle beams onto the substrate through said condenser lens; and a correcting mechanism which controls said condenser lens to correct an error in position of the irradiation occurring in accordance with a density of the pattern to be drawn on the substrate.

2. The apparatus according to claim 1, wherein said correcting mechanism corrects an error in position of the irradiation caused by the Coulomb effect.

3. The apparatus according to claim 1, wherein said correcting mechanism adjusts a front focal position of said condenser lens so as to correct an error in position of the irradiation.

4. The apparatus according to claim 1, wherein said condenser lens includes at least two electron lenses, and said correcting mechanism controls at least one of said electron lenses while maintaining an electron optical power of said condenser lens as a whole at a constant value, thereby correcting an error in position of the irradiation.

5. A charged particle beam exposure apparatus for drawing a pattern on a substrate by using a plurality of charged particle beams, the apparatus comprising:

a charged particle beam source;

an aperture array having a plurality of apertures to form a plurality of charged particle beams from a charged particle beam emitted from said charge particle beam source;

a deflector array having a plurality of deflectors to deflect the plurality of charged particle beams formed by said aperture array; and a correcting mechanism which controls said deflector array to correct an error in position of the irradiation occurring in accordance with a density of the pattern to be drawn on the substrate.

6. The apparatus according to claim 5, wherein said deflector array includes:

a first deflector array having a plurality of deflectors to deflect the plurality of charged particle beams formed by said aperture array in a first direction perpendicular to an irradiation direction of the beams, and a second deflector array having a plurality of deflectors to deflect the plurality of charged particle beams formed by said aperture array in a second direction perpendicular to the irradiation direction and to the first direction.

7. The apparatus according to claim 5, wherein said deflector array has a function of individually controlling whether the substrate is to be irradiated with the plurality of electron beams formed by said aperture array.

8. A device manufacturing method comprising the steps of:

drawing a pattern on a photosensitive substrate by irradiating a plurality of charged particle beams onto the substrate, through an irradiation system including a condenser lens, and developing the substrate, wherein the drawing step comprises the steps of
preparing a command value to control the condenser lens so as to correct an error in position of the irradiation occurring in accordance with a density of the pattern to be drawn on the substrate, and
drawing the pattern on the substrate with the plurality of charged particle beams while controlling the condenser lens in accordance with the command value prepared in the preparation step.

9. A device manufacturing method comprising the steps of:

drawing a pattern on a photosensitive substrate by irradiating a plurality of charged particle beams onto the substrate using an exposure apparatus including a deflector array arranged to deflect the plurality of charged particle beams; and developing the substrate, wherein the drawing step comprises the steps of:
preparing a command value to control the deflector array so as to correct an error in position of the irradiation occurring in accordance with a density of the pattern to be drawn on the substrate; and
drawing the pattern on the substrate with the plurality of charged particle beams while controlling the deflector array in accordance with the command value prepared in the preparation step.

10. A charged particle beam exposure method of drawing a pattern on a substrate by irradiating a plurality of charged particle beams on the substrate through an irradiation system including a condenser lens, the method comprising the steps of:

preparing a command value to control the condenser lens so as to correct an error in position of the irradiation occurring in accordance with a density of the pattern to be drawn on the substrate; and drawing the pattern on the substrate with the plurality of charged particle beams while controlling the condenser lens in accordance with the command value prepared in the preparation step.

11. A charged particle beam exposure method of drawing a pattern on a substrate by irradiating a plurality of charged particle beams on the substrate using an exposure apparatus including a deflector array arranged to deflect the plurality of charged particle beams, the method comprising the steps of:

preparing a command value to control the deflector array so as to correct an error in position of the irradiation occurring in accordance with a density of the pattern to be drawn on the substrate; and drawing the pattern on the substrate with the plurality of charged particle beams while controlling the deflector array in accordance with the command value prepared in the preparation step.

12. A charged particle beam exposure apparatus for drawing a pattern on a substrate by using a plurality of charged particle beams, the apparatus comprising:

an irradiation system which includes a condenser lens and irradiates the plurality of charged particle beams onto the substrate through said condenser lens, said condenser lens having a quadrupole lens with different electron optical powers in two directions perpendicular to an irradiation direction of the beams; and a correcting mechanism which controls said quadrupole lens to correct a distortion of a pattern to be drawn on the substrate.

13. The apparatus according to claim 12, wherein the distortion includes asymmetric distortion.

14. The apparatus according to claim 12, wherein the distortion is caused by currents of charged particle beams irradiated onto the substrate.

15. A charged particle beam exposure apparatus for drawing a pattern on a substrate by using a plurality of charged particle beams, the apparatus comprising:

a charged particle beam source;

an aperture array having a plurality of aperture to form a plurality of charged particle beams from a charged particle beam emitted from said charge particle beam source;

a first deflector array having a plurality of deflectors to deflect the plurality of charged particle beams formed by said aperture array in a first direction perpendicular to an irradiation direction of the beams;

a second deflector array having a plurality of deflectors to deflect the plurality of charge particle beams formed by said aperture array in a second direction perpendicular to the irradiation direction and to the first direction; and a correcting mechanism which controls said first and second deflector arrays to correct a distortion of a pattern to be drawn on the substrate.

16. The apparatus according to claim 15, wherein the distortion includes asymmetric distortion.

17. The apparatus according to claim 15, wherein the distortion is caused by currents of charged particle beams irradiated onto the substrate.

18. A device manufacturing method comprising the steps of:

drawing a pattern on a photosensitive substrate by irradiating a plurality of charged particle beams onto the substrate through an irradiation system including a quadrupole lens, wherein the quadrupole lens has different electron optical powers in two directions perpendicular to an irradiation direction of the beams, and the drawing step is performed such that a distortion of a pattern to be drawn on the substrate is corrected by controlling the quadrupole lens; and developing the substrate.

19. A device manufacturing method comprising the steps of:

drawing a pattern on a photosensitive substrate by irradiating a plurality of charged particle beams onto the substrate while controlling a first deflector array and a second deflector array so that a distortion of a pattern to be drawn on the substrate is corrected, wherein the first deflector array has a plurality of deflectors arranged to deflect the plurality of charged particle beams formed by an aperture array from a charged particle beam emitted by a charged particle beam source in a first direction perpendicular to an irradiation direction of the beams, and the second deflector array has a plurality of deflectors arranged to deflect the plurality of charged particle beams formed by the aperture array in a second direction perpendicular to the irradiation direction and to the first direction; and developing the substrate.

* * * * *

UNITED STATES PATENT AND TRADEMARK OFFICE
CERTIFICATE OF CORRECTION

PATENT NO. : 7,005,658 B2  Page 1 of 1
APPLICATION NO. : 10/152687
DATED : February 28, 2006
INVENTOR(S) : Masato Muraki It is certified that error appears in the above-identified patent and that said Letters Patent is hereby corrected as shown below:

ON THE COVER PAGE:
In item "(56) References Cited," under "FOREIGN PATENT DOCUMENTS," the two listed documents:  "JP    10308340  A  *  11/1998
                                                         JP    10308341  A  *  11/1998"

should read:   --JP   10-308340  A  *  11/1998
               JP   10-308341  A  *  11/1998 --.

COLUMN 9:
Line 36, "are" should read -- is --.

COLUMN 14:
Line 9, "are" should read -- is --.

COLUMN 17:
Line 36, "aperture" should read -- apertures --.

Signed and Sealed this

Fifteenth Day of August, 2006

JON W. DUDAS
*Director of the United States Patent and Trademark Office*